(12) United States Patent
Rathburn

(10) Patent No.: US 9,054,097 B2
(45) Date of Patent: Jun. 9, 2015

(54) COMPLIANT PRINTED CIRCUIT AREA ARRAY SEMICONDUCTOR DEVICE PACKAGE

(75) Inventor: James Rathburn, Mound, MN (US)

(73) Assignee: HSIO TECHNOLOGIES, LLC, Maple Grove, MN (US)

( * ) Notice: Subject to any disclaimer, the term of this patent is extended or adjusted under 35 U.S.C. 154(b) by 123 days.

(21) Appl. No.: 13/266,573

(22) PCT Filed: May 27, 2010

(86) PCT No.: PCT/US2010/036363
§ 371 (c)(1),
(2), (4) Date: Oct. 27, 2011

(87) PCT Pub. No.: WO2010/141311
PCT Pub. Date: Dec. 9, 2010

(65) Prior Publication Data
US 2012/0061846 A1    Mar. 15, 2012

Related U.S. Application Data

(60) Provisional application No. 61/183,411, filed on Jun. 2, 2009.

(51) Int. Cl.
*H01L 23/538*   (2006.01)
*H01L 23/498*   (2006.01)
(Continued)

(52) U.S. Cl.
CPC ........ *H01L 23/4985* (2013.01); *H01L 21/4867* (2013.01); *H01L 23/49822* (2013.01);
(Continued)

(58) Field of Classification Search
USPC .......................... 257/723, 628, 724, E21.614
See application file for complete search history.

(56) References Cited

U.S. PATENT DOCUMENTS

| | | | |
|---|---|---|---|
| 3,672,986 A | 6/1972 | Schneble, Jr. et al. | |
| 4,188,438 A | 2/1980 | Burns | |

(Continued)

FOREIGN PATENT DOCUMENTS

| | | |
|---|---|---|
| JP | 2003/217774 | 7/2003 |
| WO | WO 91/14015 | 9/1991 |

(Continued)

OTHER PUBLICATIONS

Notification of Transmittal of the International Search Report and the Written Opinion of the International Searching Authority issued Jul. 30, 2010 in International Application No. PCT/US2010/036043.

(Continued)

*Primary Examiner* — Bradley K Smith
*Assistant Examiner* — David Goodwin
(74) *Attorney, Agent, or Firm* — Stoel Rives LLP

(57) ABSTRACT

An integrated circuit (IC) package for an IC device, and a method of making the same. The IC package includes an interconnect assembly with at least one printed compliant layer, a plurality of first contact members located along a first major surface, a plurality of second contact members located along a second major surface, and a plurality of printed conductive traces electrically coupling a plurality of the first and second contact members. The compliant layer is positioned to bias at least the first contact members against terminals on the IC device. Packaging substantially surrounds the IC device and the interconnect assembly. The second contact members are accessible from outside the packaging.

30 Claims, 13 Drawing Sheets

(51) Int. Cl.
  *H01L 21/48* (2006.01)
  *H01L 23/552* (2006.01)
  *H01L 23/66* (2006.01)
  *H01L 23/00* (2006.01)

(52) U.S. Cl.
  CPC ............ *H01L23/552* (2013.01); *H01L 23/66* (2013.01); *H01L 24/16* (2013.01); *H01L 24/90* (2013.01); *H01L 2221/68345* (2013.01); *H01L 2223/6677* (2013.01); *H01L 2924/01013* (2013.01); *H01L 2924/01029* (2013.01); *H01L 2924/01049* (2013.01); *H01L 2924/01078* (2013.01); *H01L 2924/01079* (2013.01); *H01L 2924/01082* (2013.01); *H01L 2924/09701* (2013.01); *H01L 2924/12044* (2013.01); *H01L 2924/14* (2013.01); *H01L 2924/15174* (2013.01); *H01L 2924/19041* (2013.01); *H01L 2924/19042* (2013.01); *H01L 2924/19043* (2013.01); *H01L 2924/3011* (2013.01); *H01L 2924/3025* (2013.01); *H01L 2924/01006* (2013.01); *H01L 2924/01033* (2013.01); *H01L 2924/01047* (2013.01); *H01L 2924/01075* (2013.01); *H01L 2924/014* (2013.01); *H01L 2225/06527* (2013.01); *H01L 2225/06517* (2013.01); *H01L 2225/06572* (2013.01); *H01L 2224/81191* (2013.01); *H01L 2924/1306* (2013.01); *H01L 2224/16235* (2013.01)

(56) References Cited

U.S. PATENT DOCUMENTS

| | | |
|---|---|---|
| 4,489,999 A | 12/1984 | Miniet |
| 4,922,376 A | 5/1990 | Pommer et al. |
| 4,964,948 A | 10/1990 | Reed |
| 5,014,159 A | 5/1991 | Butt |
| 5,071,363 A | 12/1991 | Reylek et al. |
| 5,072,520 A | 12/1991 | Nelson |
| 5,127,837 A | 7/1992 | Shah et al. |
| 5,129,573 A | 7/1992 | Duffey |
| 5,161,983 A | 11/1992 | Ohno |
| 5,208,068 A * | 5/1993 | Davis et al. ................. 427/96.9 |
| 5,237,203 A | 8/1993 | Massaron |
| 5,246,880 A | 9/1993 | Reele et al. |
| 5,286,680 A | 2/1994 | Cain |
| 5,334,029 A | 8/1994 | Akkapeddi et al. |
| 5,358,621 A * | 10/1994 | Oyama ........................ 205/123 |
| 5,378,981 A | 1/1995 | Higgins, III |
| 5,419,038 A | 5/1995 | Wang et al. |
| 5,454,161 A | 10/1995 | Beilin et al. |
| 5,479,319 A | 12/1995 | Werther et al. |
| 5,509,019 A | 4/1996 | Yamamura |
| 5,527,998 A | 6/1996 | Anderson et al. |
| 5,562,462 A | 10/1996 | Matsuba et al. |
| 5,659,181 A | 8/1997 | Bridenbaugh |
| 5,674,595 A | 10/1997 | Busacco et al. |
| 5,691,041 A | 11/1997 | Frankeny et al. |
| 5,716,663 A | 2/1998 | Capote et al. |
| 5,741,624 A | 4/1998 | Jeng et al. |
| 5,746,608 A | 5/1998 | Taylor |
| 5,761,801 A | 6/1998 | Gebhardt et al. |
| 5,764,485 A | 6/1998 | Lebaschi |
| 5,772,451 A | 6/1998 | Dozler et al. |
| 5,785,538 A | 7/1998 | Beaman et al. |
| 5,787,976 A | 8/1998 | Hamburgen et al. |
| 5,791,911 A | 8/1998 | Fasano et al. |
| 5,802,699 A | 9/1998 | Fjelstad et al. |
| 5,802,711 A | 9/1998 | Card et al. |
| 5,819,579 A | 10/1998 | Roberts |
| 5,904,546 A | 5/1999 | Wood et al. |
| 5,913,109 A | 6/1999 | Distefano et al. |
| 5,921,786 A | 7/1999 | Slocum et al. |
| 5,925,931 A * | 7/1999 | Yamamoto .................... 257/737 |
| 5,933,558 A | 8/1999 | Sauvageau et al. |
| 5,973,394 A | 10/1999 | Slocum et al. |
| 6,020,597 A | 2/2000 | Kwak |
| 6,062,879 A | 5/2000 | Beaman et al. |
| 6,080,932 A | 6/2000 | Smith et al. |
| 6,107,109 A | 8/2000 | Akram et al. |
| 6,114,240 A | 9/2000 | Akram et al. |
| 6,118,426 A | 9/2000 | Albert |
| 6,120,588 A | 9/2000 | Jacobson |
| 6,137,687 A | 10/2000 | Shirai et al. |
| 6,172,879 B1 | 1/2001 | Cilia et al. |
| 6,177,921 B1 | 1/2001 | Comiskey |
| 6,178,540 B1 | 1/2001 | Lo et al. |
| 6,181,144 B1 | 1/2001 | Hembree et al. |
| 6,200,143 B1 | 3/2001 | Haba et al. |
| 6,207,259 B1 | 3/2001 | Iino et al. |
| 6,225,692 B1 | 5/2001 | Hinds |
| 6,247,938 B1 | 6/2001 | Rathburn |
| 6,252,564 B1 | 6/2001 | Albert |
| 6,255,126 B1 | 7/2001 | Mathieu et al. |
| 6,263,566 B1 | 7/2001 | Hembree et al. |
| 6,270,363 B1 | 8/2001 | Brofman et al. |
| 6,288,451 B1 | 9/2001 | Tsao |
| 6,312,971 B1 | 11/2001 | Amundson |
| 6,313,528 B1 | 11/2001 | Solberg |
| 6,320,256 B1 | 11/2001 | Ho |
| 6,350,386 B1 | 2/2002 | Lin |
| 6,359,790 B1 | 3/2002 | Meyer-Berg |
| 6,413,790 B1 | 7/2002 | Duthaler |
| 6,422,687 B1 | 7/2002 | Jacobson |
| 6,428,328 B2 | 8/2002 | Haba et al. |
| 6,437,452 B2 | 8/2002 | Lin |
| 6,437,591 B1 | 8/2002 | Farnworth et al. |
| 6,459,418 B1 | 10/2002 | Comiskey |
| 6,461,183 B1 | 10/2002 | Ohkita |
| 6,462,418 B2 | 10/2002 | Sakamoto et al. |
| 6,462,568 B1 | 10/2002 | Cram |
| 6,477,286 B1 | 11/2002 | Ouchi |
| 6,490,786 B2 | 12/2002 | Belke et al. |
| 6,506,438 B2 | 1/2003 | Duthaler et al. |
| 6,521,489 B2 | 2/2003 | Duthaler |
| 6,545,291 B1 | 4/2003 | Amundson |
| 6,572,396 B1 | 6/2003 | Rathburn |
| 6,574,114 B1 | 6/2003 | Brindle et al. |
| 6,593,535 B2 | 7/2003 | Gailus |
| 6,603,080 B2 | 8/2003 | Jensen |
| 6,614,104 B2 | 9/2003 | Farnworth et al. |
| 6,626,526 B2 | 9/2003 | Ueki |
| 6,639,578 B1 | 10/2003 | Comiskey |
| 6,642,127 B2 | 11/2003 | Kumar et al. |
| 6,652,075 B2 | 11/2003 | Jacobson |
| 6,661,084 B1 | 12/2003 | Peterson et al. |
| 6,662,442 B1 | 12/2003 | Matsui et al. |
| 6,709,967 B2 | 3/2004 | Evers |
| 6,744,126 B1 | 6/2004 | Chiang |
| 6,750,473 B2 | 6/2004 | Amundson |
| 6,750,551 B1 | 6/2004 | Frutschy et al. |
| 6,758,691 B1 | 7/2004 | McHugh |
| 6,773,302 B2 | 8/2004 | Gutierrez et al. |
| 6,800,169 B2 | 10/2004 | Liu et al. |
| 6,809,414 B1 | 10/2004 | Lin et al. |
| 6,821,131 B2 | 11/2004 | Suzuki et al. |
| 6,823,124 B1 | 11/2004 | Renn |
| 6,825,829 B1 | 11/2004 | Albert |
| 6,827,611 B1 | 12/2004 | Payne et al. |
| 6,830,460 B1 | 12/2004 | Rathburn |
| 6,840,777 B2 | 1/2005 | Sathe et al. |
| 6,853,087 B2 | 2/2005 | Neuhaus et al. |
| 6,856,151 B1 | 2/2005 | Cram |
| 6,861,345 B2 | 3/2005 | Ball et al. |
| 6,910,897 B2 | 6/2005 | Driscoll et al. |
| 6,946,325 B2 | 9/2005 | Yean et al. |
| 6,962,829 B2 | 11/2005 | Glenn et al. |
| 6,965,168 B2 | 11/2005 | Langhorn |
| 6,967,640 B2 | 11/2005 | Albert |
| 6,971,902 B2 | 12/2005 | Taylor |
| 6,987,661 B1 | 1/2006 | Huemoeller et al. |
| 6,992,376 B2 * | 1/2006 | Jaeck ........................ 257/688 |
| 7,009,413 B1 | 3/2006 | Alghouli |

(56) References Cited

U.S. PATENT DOCUMENTS

| | | | |
|---|---|---|---|
| 7,025,600 B2 | 4/2006 | Higashi | |
| 7,029,289 B2 | 4/2006 | Li | |
| 7,040,902 B2 | 5/2006 | Li | |
| 7,045,015 B2 | 5/2006 | Renn | |
| 7,064,412 B2 | 6/2006 | Geissinger et al. | |
| 7,070,419 B2 | 7/2006 | Brown et al. | |
| 7,095,090 B2 | 8/2006 | Nakajima et al. | |
| 7,101,210 B2 | 9/2006 | Lin | |
| 7,114,960 B2 | 10/2006 | Rathburn | |
| 7,118,391 B2 | 10/2006 | Minich et al. | |
| 7,121,837 B2 | 10/2006 | Sato et al. | |
| 7,121,839 B2 | 10/2006 | Rathburn | |
| 7,129,166 B2 * | 10/2006 | Speakman | 438/674 |
| 7,138,328 B2 | 11/2006 | Downey et al. | |
| 7,145,228 B2 | 12/2006 | Yean et al. | |
| 7,148,128 B2 | 12/2006 | Jacobson | |
| 7,154,175 B2 * | 12/2006 | Shrivastava et al. | 257/723 |
| 7,157,799 B2 | 1/2007 | Noquil et al. | |
| 7,180,313 B2 | 2/2007 | Bucksch | |
| 7,217,996 B2 | 5/2007 | Cheng et al. | |
| 7,220,287 B1 | 5/2007 | Wyrzykowska et al. | |
| 7,229,293 B2 | 6/2007 | Sakurai et al. | |
| 7,232,263 B2 | 6/2007 | Sashinaka et al. | |
| 7,244,967 B2 | 7/2007 | Hundt et al. | |
| 7,249,954 B2 | 7/2007 | Weiss | |
| 7,276,919 B1 | 10/2007 | Beaman et al. | |
| 7,301,105 B2 | 11/2007 | Vasoya | |
| 7,321,168 B2 | 1/2008 | Tao | |
| 7,326,064 B2 | 2/2008 | Rathburn | |
| 7,327,006 B2 | 2/2008 | Svard et al. | |
| 7,337,537 B1 | 3/2008 | Smetana, Jr. | |
| 7,382,363 B2 | 6/2008 | Albert et al. | |
| 7,402,515 B2 * | 7/2008 | Arana et al. | 438/639 |
| 7,410,825 B2 | 8/2008 | Majumdar et al. | |
| 7,411,304 B2 | 8/2008 | Kirby et al. | |
| 7,417,299 B2 | 8/2008 | Hu | |
| 7,417,314 B1 | 8/2008 | Lin et al. | |
| 7,422,439 B2 | 9/2008 | Rathburn et al. | |
| 7,423,219 B2 | 9/2008 | Kawaguchi et al. | |
| 7,427,717 B2 | 9/2008 | Morimoto et al. | |
| 7,432,600 B2 | 10/2008 | Klein et al. | |
| 7,458,150 B2 | 12/2008 | Totokawa et al. | |
| 7,459,393 B2 | 12/2008 | Farnworth et al. | |
| 7,485,345 B2 | 2/2009 | Renn | |
| 7,489,524 B2 | 2/2009 | Green et al. | |
| 7,508,076 B2 | 3/2009 | Japp et al. | |
| 7,527,502 B2 | 5/2009 | Li | |
| 7,531,906 B2 | 5/2009 | Lee | |
| 7,536,714 B2 * | 5/2009 | Yuan | 726/7 |
| 7,537,461 B2 | 5/2009 | Rathburn | |
| 7,538,415 B1 | 5/2009 | Lin et al. | |
| 7,548,430 B1 | 6/2009 | Huemoeller et al. | |
| 7,563,645 B2 * | 7/2009 | Jaeck | 438/117 |
| 7,595,454 B2 | 9/2009 | Kresge et al. | |
| 7,619,309 B2 * | 11/2009 | Drexl et al. | 257/758 |
| 7,621,761 B2 | 11/2009 | Mok et al. | |
| 7,628,617 B2 | 12/2009 | Brown et al. | |
| 7,632,106 B2 | 12/2009 | Nakamura | |
| 7,645,635 B2 | 1/2010 | Wood et al. | |
| 7,651,382 B2 | 1/2010 | Yasumura et al. | |
| 7,658,163 B2 | 2/2010 | Renn | |
| 7,674,671 B2 | 3/2010 | Renn | |
| 7,726,984 B2 | 6/2010 | Bumb et al. | |
| 7,736,152 B2 | 6/2010 | Hougham et al. | |
| 7,748,110 B2 | 7/2010 | Asahi et al. | |
| 7,758,351 B2 | 7/2010 | Brown et al. | |
| 7,800,916 B2 | 9/2010 | Blackwell et al. | |
| 7,833,832 B2 | 11/2010 | Wood et al. | |
| 7,836,587 B2 | 11/2010 | Kim | |
| 7,868,469 B2 | 1/2011 | Mizoguchi | |
| 7,874,847 B2 | 1/2011 | Matsui et al. | |
| 7,897,503 B2 | 3/2011 | Foster et al. | |
| 7,898,087 B2 | 3/2011 | Chainer | |
| 7,955,088 B2 | 6/2011 | Di Stefano | |
| 7,999,369 B2 | 8/2011 | Malhan et al. | |
| 8,044,502 B2 | 10/2011 | Rathburn | |
| 8,058,558 B2 | 11/2011 | Mok et al. | |
| 8,072,058 B2 * | 12/2011 | Kim et al. | 257/691 |
| 8,114,687 B2 | 2/2012 | Mizoguchi | |
| 8,120,173 B2 * | 2/2012 | Forman et al. | 257/723 |
| 8,148,643 B2 | 4/2012 | Hirose et al. | |
| 8,154,119 B2 | 4/2012 | Yoon et al. | |
| 8,158,503 B2 | 4/2012 | Abe | |
| 8,159,824 B2 | 4/2012 | Cho et al. | |
| 8,178,978 B2 | 5/2012 | McElrea et al. | |
| 8,203,207 B2 | 6/2012 | Getz et al. | |
| 8,227,703 B2 | 7/2012 | Maruyama et al. | |
| 8,232,632 B2 | 7/2012 | Rathburn | |
| 8,247,702 B2 | 8/2012 | Kouya | |
| 8,278,141 B2 * | 10/2012 | Chow et al. | 438/106 |
| 8,299,494 B2 | 10/2012 | Yilmaz et al. | |
| 8,329,581 B2 | 12/2012 | Haba et al. | |
| 8,344,516 B2 | 1/2013 | Chainer | |
| 8,373,428 B2 | 2/2013 | Eldridge et al. | |
| 8,421,151 B2 | 4/2013 | Yamashita | |
| 8,525,322 B1 * | 9/2013 | Kim et al. | 257/691 |
| 8,525,346 B2 | 9/2013 | Rathburn | |
| 8,536,714 B2 * | 9/2013 | Sakaguchi | 257/778 |
| 8,536,889 B2 | 9/2013 | Nelson et al. | |
| 8,610,265 B2 | 12/2013 | Rathburn | |
| 8,618,649 B2 | 12/2013 | Rathburn | |
| 8,758,067 B2 | 6/2014 | Rathburn | |
| 8,789,272 B2 | 7/2014 | Rathburn | |
| 8,803,539 B2 | 8/2014 | Rathburn | |
| 8,829,671 B2 | 9/2014 | Rathburn | |
| 8,912,812 B2 | 12/2014 | Rathburn | |
| 8,928,344 B2 | 1/2015 | Rathburn | |
| 8,955,215 B2 | 2/2015 | Rathburn | |
| 8,955,216 B2 | 2/2015 | Rathburn | |
| 8,970,031 B2 | 3/2015 | Rathburn | |
| 8,981,568 B2 | 3/2015 | Rathburn | |
| 8,981,809 B2 | 3/2015 | Rathburn | |
| 8,984,748 B2 | 3/2015 | Rathburn | |
| 8,987,886 B2 | 3/2015 | Rathburn | |
| 8,988,093 B2 | 3/2015 | Rathburn | |
| 2001/0012707 A1 | 8/2001 | Ho et al. | |
| 2001/0016551 A1 | 8/2001 | Yishio et al. | |
| 2002/0011639 A1 | 1/2002 | Carlson et al. | |
| 2002/0027441 A1 | 3/2002 | Akram et al. | |
| 2002/0062200 A1 | 5/2002 | Mori et al. | |
| 2002/0079912 A1 | 6/2002 | Shahriari et al. | |
| 2002/0088116 A1 | 7/2002 | Milkovich et al. | |
| 2002/0098740 A1 | 7/2002 | Ooya | |
| 2002/0105080 A1 | 8/2002 | Speakman | |
| 2002/0105087 A1 | 8/2002 | Forbes et al. | |
| 2002/0160103 A1 | 10/2002 | Fukunaga et al. | |
| 2003/0003779 A1 | 1/2003 | Rathburn | |
| 2003/0096512 A1 | 5/2003 | Cornell | |
| 2003/0114029 A1 | 6/2003 | Lee et al. | |
| 2003/0117161 A1 | 6/2003 | Burns | |
| 2003/0156400 A1 | 8/2003 | Dibene et al. | |
| 2003/0162418 A1 | 8/2003 | Yamada | |
| 2003/0164548 A1 | 9/2003 | Lee | |
| 2003/0188890 A1 | 10/2003 | Bhatt et al. | |
| 2003/0189083 A1 | 10/2003 | Olsen | |
| 2003/0231819 A1 | 12/2003 | Palmer et al. | |
| 2004/0016995 A1 | 1/2004 | Kuo et al. | |
| 2004/0029411 A1 | 2/2004 | Rathburn | |
| 2004/0048523 A1 | 3/2004 | Huang et al. | |
| 2004/0054031 A1 | 3/2004 | Jacobson | |
| 2004/0070042 A1 | 4/2004 | Lee et al. | |
| 2004/0077190 A1 | 4/2004 | Huang et al. | |
| 2004/0174180 A1 | 9/2004 | Fukushima et al. | |
| 2004/0183557 A1 | 9/2004 | Akram | |
| 2004/0184219 A1 | 9/2004 | Otsuka et al. | |
| 2004/0217473 A1 | 11/2004 | Shen | |
| 2004/0243348 A1 | 12/2004 | Minatani | |
| 2005/0020116 A1 | 1/2005 | Kawazoe et al. | |
| 2005/0048680 A1 | 3/2005 | Matsunami | |
| 2005/0100294 A1 | 5/2005 | Nguyen et al. | |
| 2005/0101164 A1 | 5/2005 | Rathburn | |
| 2005/0162176 A1 | 7/2005 | Bucksch | |
| 2005/0164527 A1 | 7/2005 | Radza et al. | |
| 2005/0196511 A1 | 9/2005 | Garrity et al. | |

(56) References Cited

U.S. PATENT DOCUMENTS

| | | |
|---|---|---|
| 2005/0253610 A1 | 11/2005 | Cram |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Andersen |
| 2006/0087064 A1 | 4/2006 | Daniel et al. |
| 2006/0125500 A1 | 6/2006 | Watkins et al. |
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0258912 A1 | 11/2006 | Belson et al. |
| 2006/0261827 A1 | 11/2006 | Cooper et al. |
| 2006/0281303 A1 | 12/2006 | Trezza et al. |
| 2007/0021002 A1 | 1/2007 | Laurx et al. |
| 2007/0059901 A1 | 3/2007 | Majumdar et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0182431 A1 | 8/2007 | Komatsu et al. |
| 2007/0201209 A1 | 8/2007 | Francis et al. |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0267138 A1 | 11/2007 | White et al. |
| 2007/0269999 A1 | 11/2007 | Di Stefano |
| 2007/0273394 A1 | 11/2007 | Tanner et al. |
| 2007/0287304 A1 | 12/2007 | Eldridge |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0115961 A1 | 5/2008 | Mok et al. |
| 2008/0143358 A1 | 6/2008 | Breinlinger |
| 2008/0143367 A1 | 6/2008 | Chavineau-Lovgren |
| 2008/0156856 A1 | 7/2008 | Barausky et al. |
| 2008/0157361 A1 | 7/2008 | Wood et al. |
| 2008/0182436 A1 | 7/2008 | Rathburn |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0246136 A1 | 2/2009 | Beer et al. |
| 2009/0058444 A1 | 3/2009 | McIntyre |
| 2009/0061089 A1 | 3/2009 | King |
| 2009/0065918 A1 | 3/2009 | Murphy |
| 2009/0127698 A1 | 5/2009 | Rathburn |
| 2009/0133906 A1 | 5/2009 | Baek |
| 2009/0158581 A1 | 6/2009 | Nguyen et al. |
| 2009/0180236 A1 | 7/2009 | Lee et al. |
| 2009/0224404 A1 | 9/2009 | Wood et al. |
| 2009/0241332 A1 | 10/2009 | Lauffer et al. |
| 2009/0267628 A1 | 10/2009 | Takase |
| 2009/0321915 A1 | 12/2009 | Hu et al. |
| 2010/0022105 A1 | 1/2010 | Di Stefano |
| 2010/0133680 A1 | 6/2010 | Kang et al. |
| 2010/0143194 A1 | 6/2010 | Lee et al. |
| 2010/0213960 A1 | 8/2010 | Mok et al. |
| 2010/0300734 A1 | 12/2010 | Ables et al. |
| 2011/0083881 A1 | 4/2011 | Nguyen et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0330942 A1 | 12/2013 | Rathburn |
| 2014/0043782 A1 | 2/2014 | Rathburn |
| 2014/0080258 A1 | 3/2014 | Rathburn |
| 2014/0192498 A1 | 7/2014 | Rathburn |
| 2014/0220797 A1 | 8/2014 | Rathburn |
| 2014/0225255 A1 | 8/2014 | Rathburn |
| 2014/0242816 A1 | 8/2014 | Rathburn |
| 2015/0013901 A1 | 1/2015 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO-2012/061008 | 5/2012 |
| WO | WO-2012/074963 | 6/2012 |
| WO | WO-2012/074969 | 6/2012 |
| WO | WO-2012/078493 | 6/2012 |
| WO | WO 2012/122142 | 9/2012 |
| WO | WO 2012/125331 | 9/2012 |
| WO | WO 2013/036565 | 3/2013 |
| WO | WO-2014/011226 | 1/2014 |
| WO | WO-2014/011228 | 1/2014 |
| WO | WO-2014/011232 | 1/2014 |
| WO | WO-2015/006393 | 1/2015 |

(56) References Cited

FOREIGN PATENT DOCUMENTS

OTHER PUBLICATIONS

Notification of Transmittal of the International Search Report and the Written Opinion of the International Searching Authority issued Jul. 21, 2010 in International Application No. PCT/US2010/036047.
Notification of Transmittal of the International Search Report and the Written Opinion of the International Searching Authority issued Jul. 28, 2010 in International Application No. PCT/US2010/036363.
Notification of Transmittal of the International Search Report and the Written Opinion of the International Searching Authority issued Jul. 28, 2010 in International Application No. PCT/US2010/036377.
Notification of Transmittal of the International Search Report and the Written Opinion of the International Searching Authority issued Jul. 30, 2010 in International Application No. PCT/US2010/036388.
Notification of Transmittal of the International Search Report and the Written Opinion of the International Searching Authority issued Jul. 27, 2010 in International Application No. PCT/US2010/036397.
Notification of Transmittal of the International Search Report and the Written Opinion of the International Searching Authority issued Jul. 30, 2010 in International Application No. PCT/US2010/036055.
Notification of Transmittal of the International Search Report and the Written Opinion of the International Searching Authority issued Aug. 4, 2010 in International Application No. PCT/US2010/036288.
Notification of Transmittal of the International Search Report and the Written Opinion of the International Searching Authority issued Aug. 4, 2010 in International Application No. PCT/US2010/036285.
Notification of Transmittal of the International Search Report and the Written Opinion of the International Searching Authority issued Jul. 30, 2010 in International Application No. PCT/US2010/036282.
Notification of Transmittal of the International Search Report and the Written Opinion of the International Searching Authority issued Jul. 30, 2010 in International Application No. PCT/US2010/036295.
Notification of Transmittal of the International Search Report and the Written Opinion of the International Searching Authority issued Jul. 30, 2010 in International Application No. PCT/US2010/036313.
Notification of Transmittal of the International Search Report and the Written Opinion of the International Searching Authority issued Aug. 3, 2010 in International Application No. PCT/US2010/037619.
Notification of Transmittal of the International Search Report and the Written Opinion of the International Searching Authority issued Sep. 7, 2010 in International Application No. PCT/US2010/038600.
Notification of Transmittal of the International Search Report and the Written Opinion of the International Searching Authority issued Aug. 18, 2010 in International Application No. PCT/US2010/038606.
Notification of Transmittal of the International Search Report and the Written Opinion of the International Searching Authority issued Sep. 1, 2010 in International Application No. PCT/US2010/040188.
Notification of Transmittal of the International Search Report and the Written Opinion of the International Searching Authority issued Aug. 20, 2010 in International Application No. PCT/US2010/040197.
Notification of Transmittal of the International Search Report and the Written Opinion of the International Searching Authority issued Apr. 14, 2011 in International Application No. PCT/US2011/023138.
Notification of Transmittal of the International Search Report and the Written Opinion of the International Searching Authority issued Aug. 17, 2011 in International Application No. PCT/US2011/033726.
Notification of Transmittal of the International Search Report and the Written Opinion of the International Searching Authority issued Sep. 27, 2011 in International Application No. PCT/US2011/038845.
Co-pending U.S. Appl. No. 13/266/486 titled High Performance Surface Mount Electrical Interconnect, filed Oct. 27, 2011.
Co-pending U.S. Appl. No. 13/266,522, titled Compliant Wafer Level Probe Assembly, filed Oct. 27, 2011.
Co-pending U.S. Appl. No. 13/266,907, titled Compliant Printed Circuit Socket Diagnostic Tool, filed Oct. 28, 2011.
Co-pending U.S. Appl. No. 13/318,038, titled Compliant Printed Circuit Wafer Probe Diagnostic Tool, filed Oct. 28, 2011.
Co-pending U.S. Appl. No. 13/318,171, titled Compliant Printed Circuit Peripheral Lead Semiconductor Test Socket, filed Oct. 31, 2011.
Co-pending U.S. Appl. No. 13/318,181, titled Compliant Printed Circuit Peripheral Lead Semiconductor Package, filed Oct. 31, 2011.
Co-pending U.S. Appl. No. 13/318,200, titled Compliant Printed Circuit Wafer Level Semiconductor Package, filed Oct. 31, 2011.
Co-pending U.S. Appl. No. 13/318,263, titled Compliant Printed Circuit Semiconductor Package, filed Oct. 31, 2011.
Co-pending U.S. Appl. No. 13/320,285, titled Compliant Printed Flexible Circuit, filed Nov. 14, 2011.
Co-pending U.S. Appl. No. 13/318,369, titled Composite Polymer-Metal Electrical Contacts, filed Nov. 1, 2011.
Co-pending U.S. Appl. No. 13/318,382, titled Resilient Conductive Electrical Interconnect, filed Nov. 1, 2011.
Co-pending U.S. Appl. No. 13/319,120, titled Simulated Wirebond Semiconductive Package, filed Nov. 7, 2011.
Co-pending U.S. Appl. No. 13/319,145, titled Semiconductor Die Terminal, filed Nov. 7, 2011.
Co-pending U.S. Appl. No. 13/319,158, titled Semiconductor Socket, filed Nov. 7, 2011.
Co-pending U.S. Appl. No. 13/319,203, titled Compliant Printed Circuit Semiconductor Tester Interface, filed Nov. 7, 2011.
Co-pending U.S. Appl. No. 13/319,228, titled Singulated Semiconductor Device Separable Electrical Interconnect, filed Nov. 7, 2011.
Notification of Transmittal of the International Search Report and the Written Opinion of the International Searching Authority mailed Nov. 29, 2012 in International Application No. PCT/US2012/053848.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Restriction Requirement mailed Nov. 23, 2012 in co-pending U.S. Appl. No. 13/318,263, now published as US Patent Application Publication No. US 2012/0043667.
Co-pending U.S. Appl. No. 13/643,436 titled Semiconductor Device Package Adapter, filed Oct. 25, 2012.
Co-pending U.S. Appl. No. 13/700,639 titled Electrical Connector Insulator Housing, filed Nov. 28, 2012.
Notification of Transmittal of the International Search Report and the Written Opinion of the International Searching Authority mailed Feb. 8, 2012 in International Application No. PCT/US2011/0.
Notification of Transmittal of the International Search Report and the Written Opinion of the International Searching Authority mailed Mar. 26, 2012 in International Application No. PCT/US2011/062313.
Co-pending U.S. Appl. No. 13/410,914, titled Metalized Pad to Electrical Contact Interface, filed Mar. 2, 2012.
Co-pending U.S. Appl. No. 13/410,943, titled Area Array Semiconductor Device Package Interconnect Structure With Optional Package-to-Package or Flexible Circuit to Package Connection, filed Mar. 2, 2012.
Co-pending U.S. Appl. No. 13/412,870, titled Selective Metalization of Electrical Connector or Socket Housing, filed Mar. 6, 2012.
Co-pending U.S. Appl. No. 13/413,032, titled Bumped Semiconductor Wafer or Die Level Electrical Interconnect, filed Mar. 6, 2012.
Co-pending U.S. Appl. No. 13/413,724, titled Copper Pillar Full Metal Via Electrical Circuit Structure, filed Mar. 7, 2012.
Co-pending U.S. Appl. No. 13/418,853, titled High Performance Surface Mount Electrical Interconnect With External Biased Normal Force Loading, filed Mar. 13, 2012.
Response to Restriction Requirement filed Jul. 15, 2013 in co-pending U.S. Appl. No. 13/266,486, now published as US Patent Application Publication No. US 2012/0055701.

(56) References Cited

OTHER PUBLICATIONS

Restriction Requirement mailed Sep. 25, 2013 in co-pending U.S. Appl. No. 13/266,486, now published as US Patent Application Publication No. US 2012/0055701.
Response to Restriction Requirement filed Oct. 2, 2013 in co-pending U.S. Appl. No. 13/266,486, now published as US Patent Application Publication No. US 2012/0055701.
Office Action mailed Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Notice of Allowance and Fee(s) Due mailed Jul. 17, 2013 in co-pending U.S. Appl. No. 13/448,914, now published as US Patent Application Publication No. US 2012/0202364.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Sep. 16, 2013 in co-pending U.S. Appl. No. 13/413,724, now published as US Patent Application Publication No. US 2012/0168948.
Restriction Requirement mailed Sep. 26, 2013 in co-pending U.S. Appl. No. 13/319,120 now published as US Patent Application Publication No. US 2012/0061851.
Notice of Allowance and Fee(s) Due mailed Oct. 2, 2013 in co-pending U.S. Appl. No. 13/448,865, now published as US Patent Application Publication No. US 2012/0199985.
Restriction Requirement mailed Oct. 1, 2013 in co-pending U.S. Appl. No. 13/319,145, now published as US Patent Application Publication No. 2012/0049342.
Co-pending U.S. Appl. No. 13/969,953 titled Compliant Conductive Nano-Particle Electrical Interconnect, filed Aug. 19, 2013.
Co-pending U.S. Appl. No. 13/575,368, titled High Speed Backplane Connector, filed Jul. 26, 2012.
Notification of Transmittal of the International Search Report and the Written Opinion of the International Searching Authority mailed Apr. 5, 2012 in International Application No. PCT/US2011/062321.
Notification of Transmittal of the International Search Report and the Written Opinion of the International Searching Authority mailed Mar. 29, 2012 in International Application No. PCT/US2011/063247.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Co-pending U.S. Appl. No. 13/448,865, titled Compliant Conductive Nano-Particle Electrical Interconnect, filed Apr. 17, 2012.
Co-pending U.S. Appl. No. 13/448,914, titled Compliant Core Peripheral Lead Semiconductor Test Socket, filed Apr. 17, 2012.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 3013 in co-pending U.S. Appl. No. 13/318,200, now published as US Patent Application Publication No. US 2012/0056332.
Amendment and Response filed Mar. 4, 2013 in co-pending U.S. Appl. No. 13/318,263, now published as US Patent Application Publication No. US 2012/0043667.
Co-pending U.S. Appl. No. 13/879,783 titled High Performance Electrical Circuit Structure, filed Apr. 16, 2013.
Co-pending U.S. Appl. No. 13/879,883 titled High Performance Surface Mount Electrical Interconnect, filed Apr. 17, 2013.
Co-pending U.S. Appl. No. 13/880,231 titled Electrical Interconnect IC Device Socket, filed Apr. 18, 2013.
Co-pending U.S. Appl. No. 13/880,461 titled Electrical Interconnect IC Device Socket, filed Apr. 19, 2013.
Liu, et al, "All-Polymer Capacitor Fabricated with Inkjet Printing Technique," Solid-State Electronics, vol. 47, pp. 1543-1548 (2003).
Notification of Transmittal of the International Search Report and the Written Opinion of the International Searching Authority mailed Jun. 7, 2013 in International Application No. PCT/US2013/030856.
Notification of Transmittal of the International Search Report and the Written Opinion of the International Searching Authority mailed Jun. 19, 2013 in International Application No. PCT/US2013/030981.
Notification of Transmittal of the International Search Report and the Written Opinion of the International Searching Authority mailed Jun. 3, 2013 in International Application No. PCT/US2013/031395.
Restriction Requirement mailed Jun. 13, 2013 in co-pending U.S. Appl. No. 13/266,486, now published as US Patent Application Publication No. US 2012/0055701.
Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Examiner-Initiated Interview Summary mailed Mar. 14, 2013 in co-pending U.S. Appl. No. 13/319,228, now published as US Patent Application Publication No. US 2012/0058653.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Notice of Allowance and Fee(s) Due mailed Nov. 24, 2014 in co-pending U.S. Appl. No. 13/266,486, now published as US Patent Application Publication No. US 2012/0055701.
Supplemental Notice of Allowance mailed Dec. 24, 2014 in co-pending U.S. Appl. No. 13/266,486, now published as US Patent Application Publication No. US 2012/0055701.
Supplemental Notice of Allowance mailed Dec. 19, 2014 in co-pending U.S. Appl. No. 13/318,181, now published as US Patent Application Publication No. US 2012/0044659.
Office Action mailed Nov. 19, 2014 in co-pending U.S. Appl. No. 13/318,200, now published as US Patent Application Publication No. US 2012/0056332.
Office Action mailed Nov. 14, 2014 in co-pending U.S. Appl. No. 13/318,369, now published as US Patent Application Publication No. US 2012/0043119.
Amendment and Response and Terminal Disclaimer filed Nov. 14, 2014 in co-pending U.S. Appl. No. 13/318,382, now published as US Patent Application Publication No. US 2012/0043130.
Notice of Allowance and Fee(s) Due mailed Dec. 19, 2014 in co-pending U.S. Appl. No. 13/319,145 now published as US Patent Application Publication No. US 2012/0049342.
Amendment and Response Under Rule 1.116 and Request After Final Consideration Program 2.0 filed Dec. 18, 2014 in co-pending U.S. Appl. No. 13/319,158, now published as US Patent Application Publication No. 2012/0051016.

(56) References Cited

OTHER PUBLICATIONS

Advisory Action mailed Jan. 2, 2015 in co-pending U.S. Appl. No. 13/319,158, now published as US Patent Application Publication No. 2012/0051016.
Request for Continued Examination filed Nov. 12, 2014 in co-pending U.S. Appl. No. 13/319,203, now published as US Patent Application Publication No. 2012/0056640.
Notice of Allowance and Fee(s) Due mailed Dec. 10, 2014 in co-pending U.S. Appl. No. 13/319,203, now published as US Patent Application Publication No. 2012/0056640.
Amendment and Response and Terminal Disclaimer filed Nov. 17, 2014 in co-pending U.S. Appl. No. 13/319,228, now published as US Patent Application Publication No. US 2012/0058653.
Notice of Allowance and Fee(s) Due mailed Jan. 13, 2015 in co-pending U.S. Appl. No. 13/319,228, now published as US Patent Application Publication No. US 2012/0058653.
Amendment and Response filed Nov. 19, 2014 in co-pending U.S. Appl. No. 13/643,436, now published as US Patent Application Publication No. 2013/0105984.
Response Under Rule 1.116 filed Nov. 11, 2014 in co-pending U.S. Appl. No. 13/700,639, now published as US Patent Application Publication No. 2013/0078860.
Amendment and Response and RCE filed Dec. 30, 2014 in co-pending U.S. Appl. No. 13/700,639, now published as US Patent Application Publication No. 2013/0078860.
Advisory Action mailed Dec. 3, 2014 in co-pending U.S. Appl. No. 13/700,639, now published as US Patent Application Publication No. 2013/0078860.
Office Action mailed Nov. 17, 2014 in co-pending U.S. Appl. No. 13/879,883, now published as US Patent Application Publication No. 2013/0244490.
Office Action mailed Dec. 26, 2014 in co-pending U.S. Appl. No. 13/410,914, now published as US Patent Application Publication No. US 2012/0164888.
Restriction Requirement mailed Nov. 19, 2014 in co-pending U.S. Appl. No. 13/413,032, now published as US Patent Application Publication No. US 2012/0182035.
Response to Restriction Requirement filed Nov. 20, 2014 in co-pending U.S. Appl. No. 13/413,032, now published as US Patent Application Publication No. US 2012/0182035.
Notice of Allowance and Fee(s) Due mailed Jan. 5, 2015 in co-pending U.S. Appl. No. 13/413,032, now published as US Patent Application Publication No. US 2012/0182035.
Co-pending U.S. Appl. No. 14/408,205 titled Hybrid Printed Circuit Assembly With Low Density Main Core and Embedded High Density Circuit Regions, filed Dec. 15, 2014.
Co-pending U.S. Appl. No. 14/408,039 titled High Speed Circuit Assembly With Integral Terminal and Mating Bias Loading Electrical Connector Assembly, filed Dec. 15, 2014.
Co-pending U.S. Appl. No. 14/408,338 titled Semiconductor Socket With Direct Selective Metalization, filed Dec. 16, 2014.
Co-pending U.S. Appl. No. 14/565,724 titled Performance Enhanced Semiconductor Socket, filed Dec. 10, 2014.
Print—Definition of Print by the Free Dictionary, http://www.thefreedictionary.com/print, Aug. 13, 2014.
Amendment and Response Under Rule 1.116 filed Jul. 10, 2014 in co-pending U.S. Appl. No. 13/266,486, now published as US Patent Application Publication No. US 2012/0055701.
Advisory Action mailed Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Amendment and Response Under Rule 1.116 mailed Jul. 10, 2014 in co-pending U.S. Appl. No. 13/266,907, now published as US Patent Application Publication No. US 2012/0268155.
Advisory Action mailed Jul. 25, 2014 in co-pending U.S. Appl. No. 13/266,907, now published as US Patent Application Publication No. US 2012/0268155.
Advisory Action mailed Aug. 8, 2014 in co-pending U.S. Appl. No. 13/266,907, now published as US Patent Application Publication No. US 2012/0268155.
Amendment and Response to Final Office Action and RCE filed Aug. 26, 2014 in co-pending U.S. Appl. No. 13/266,907, now published as US Patent Application Publication No. US 2012/0268155.
Final Office Action mailed Aug. 1, 2014 in co-pending U.S. Appl. No. 13/318,038, now published as US Patent Application Publication No. US 2012/0062270.
Amendment and Response filed Jul. 27, 2014 in co-pending U.S. Appl. No. 13/318,181, now published as US Patent Application Publication No. US 2012/0044659.
Office Action mailed Jul. 29, 2014 in co-pending U.S. Appl. No. 13/320,285, now published as US Patent Application Publication No. US 2012/0055702.
Final Office Action mailed Jul. 31, 2014 in co-pending U.S. Appl. No. 13/320,285, now published as US Patent Application Publication No. US 2012/0055702.
Office Action mailed Aug. 26, 2014 in co-pending U.S. Appl. No. 13/318,382, now published as US Patent Application Publication No. US 2012/0043130.
Final Office Action mailed Aug. 4, 2014 in co-pending U.S. Appl. No. 13/319,145, now published as US Patent Application Publication No. 2012/0049342.
Amendment and Response filed Sep. 3, 2014 in co-pending U.S. Appl. No. 13/319,158, now published as US Patent Application Publication No. 2012/0051016.
Final Office Action mailed Aug. 20, 2014 in co-pending U.S. Appl. No. 13/319,203, now published as US Patent Application Publication No. 2012/0056640.
Office Action mailed Sep. 4, 2014 in co-pending U.S. Appl. No. 13/319,228, now published as US Patent Application Publication No. US 2012/0058653.
Amendment and Response filed Jul. 30, 2014 in co-pending U.S. Appl. No. 13/700,639, now published as US Patent Application Publication No. 2013/0078860.
Response to Restriction Requirement filed Jul. 17, 2014 in co-pending U.S. Appl. No. 13/879,883, now published as US Patent Application Publication No. 2013/0223034.
Amendment and Response Under Rule 1.116 filed Jul. 29, 2014 in co-pending U.S. Appl. No. 13/410,914, now published as US Patent Application Publication No. US 2012/0164888.
Advisory Action mailed Aug. 12, 2014 in co-pending U.S. Appl. No. 13/410,914, now published as US Patent Application Publication No. US 2012/0164888.
Restriction Requirement mailed Jul. 31, 2014 in co-pending U.S. Appl. No. 13/410,943, now published as US Patent Application Publication No. US 2012/0161317.
Response to Restriction Requirement filed Aug. 19, 2014 in co-pending U.S. Appl. No. 13/410,943, now published as US Patent Application Publication No. US 2012/0161317.
Amendment and Response filed Aug. 26, 2014 in co-pending U.S. Appl. No. 13/418,853, now published as US Patent Application Publication No. US 2012/0244728.
Co-pending U.S. Appl. No. 14/327,916 titled Matrix Defined Electrical Circuit Structure, filed Jul. 10, 2014.
Notification of Transmittal of the International Search Report and the Written Opinion of the International Searching Authority mailed Oct. 27, 2014 in International Application No. PCT/US2014/045856.
*Ex Parte Quayle* Action mailed Oct. 1, 2014 in co-pending U.S. Appl. No. 13/266,486, now published as US Patent Application Publication No. US 2012/0055701.
Amendment and Response After *ExParte Quayle* Action filed Oct. 6, 2014 in co-pending U.S. Appl. No. 13/266,486, now published as US Patent Application Publication No. US 2012/0055701.
Notice of Non-Compliant Amendment mailed Oct. 14, 2014 in co-pending U.S. Appl. No. 13/266,486, now published as US Patent Application Publication No. US 2012/0055701.
Corrected Amendment and Response filed Oct. 15, 2014 in co-pending U.S. Appl. No. 13/266,486, now published as US Patent Application Publication No. US 2012/0055701.

(56) References Cited

OTHER PUBLICATIONS

Notice of Allowance and Fee(s) Due mailed Oct. 8, 2014 in co-pending U.S. Appl. No. 13/266,907, now published as US Patent Application Publication No. US 2012/0268155.
Amendment and Response Under Rule 1.116 and Termination Disclaimer filed Sep. 4, 2014 in co-pending U.S. Appl. No. 13/318,038, now published as US Patent Application Publication No. US 2012/0062270.
Terminal Disclaimer Review Decision mailed Sep. 8, 2014 in co-pending U.S. Appl. No. 13/318,038, now published as US Patent Application Publication No. US 2012/0062270.
Notice of Allowance and Fee(s) Due mailed Sep. 30, 2014 in co-pending U.S. Appl. No. 13/318,038, now published as US Patent Application Publication No. US 2012/0062270.
Notice of Allowance and Fee(s) Due mailed Oct. 24, 2014 in co-pending U.S. Appl. No. 13/318,181, now published as US Patent Application Publication No. US 2012/0044659.
Amendment and Response and Examiner's Interview Summary filed Oct. 15, 2014 in co-pending U.S. Appl. No. 13/320,285, now published as US Patent Application Publication No. US 2012/0055702.
Restriction Requirement mailed Sep. 8, 2014 in co-pending U.S. Appl. No. 13/318,369, now published as US Patent Application Publication No. US 2012/0043119.
Response to Restriction Requirement filed Oct. 13, 2014 in co-pending U.S. Appl. No. 13/318,369, now published as US Patent Application Publication No. US 2012/0043119.
Applicant-Initiated Interview Summary mailed Sep. 12, 2014 in co-pending U.S. Appl. No. 13/319,120 now published as US Patent Application Publication No. US 2012/0061851.
Amendment and Response and RCE filed Oct. 1, 2014 in co-pending U.S. Appl. No. 13/319,120 now published as US Patent Application Publication No. US 2012/0061851.
Notice of Allowance and Fee(s) Due mailed Oct. 27, 2014 in co-pending U.S. Appl. No. 13/319,120 now published as US Patent Application Publication No. US 2012/0061851.
Applicant-Initiated Interview Summary mailed Sep. 12, 2014 in co-pending U.S. Appl. No. 13/319,145 now published as US Patent Application Publication No. US 2012/0049342.
Amendment and Response Under Rule 1.116 filed Sep. 18, 2014 in co-pending U.S. Appl. No. 13/319,145 now published as US Patent Application Publication No. US 2012/0049342.
Final Office Action mailed Nov. 6, 2014 in co-pending U.S. Appl. No. 13/319,158, now published as US Patent Application Publication No. 2012/0051016.
Amendment and Response Under Rule 1.116 filed Oct. 2, 2014 in co-pending U.S. Appl. No. 13/319,203, now published as US Patent Application Publication No. 2012/0056640.
Applicant-Initiated Interview Summary mailed Oct. 9, 2014 in co-pending U.S. Appl. No. 13/319,203, now published as US Patent Application Publication No. 2012/0056640.
Advisory Action mailed Oct. 16, 2014 in co-pending U.S. Appl. No. 13/319,203, now published as US Patent Application Publication No. 2012/0056640.
Notice of Abandonment mailed Oct. 10, 2014 in co-pending U.S. Appl. No. 13/575,368, now published as US Patent Application Publication No. 2013/0203273.
Office Action mailed Sep. 17, 2014 in co-pending U.S. Appl. No. 13/643,436, now published as US Patent Application Publication No. 2013/0105984.
Final Office Action mailed Sep. 8, 2014 in co-pending U.S. Appl. No. 13/700,639, now published as US Patent Application Publication No. 2013/0078860.
Office Action mailed Oct. 6, 2014 in co-pending U.S. Appl. No. 13/879,783, now published as US Patent Application Publication No. 2013/0223034.
Amendment and Response and RCE filed Sep. 30, 2014 in co-pending U.S. Appl. No. 13/410,914, now published as US Patent Application Publication No. US 2012/0164888.
Final Office Action mailed Oct. 28, 2014 in co-pending U.S. Appl. No. 13/418,853, now published as US Patent Application Publication No. US 2012/0244728.
Amendment and Response and Terminal Disclaimer filed Apr. 2, 2014 in co-pending U.S. Appl. No. 13/318,038, now published as US Patent Application Publication No. US 2012/0062270.
Terminal Disclaimer Revision Decision mailed Apr. 2, 2014 in co-pending U.S. Appl. No. 13/318,038, now published as US Patent Application Publication No. US 2012/0062270.
Notice of Allowance and Fee(s) Due mailed Mar. 14, 2014 in co-pending U.S. Appl. No. 13/318,171, now published as US Patent Application Publication No. US 2012/0049877.
Office Action mailed Apr. 21, 2014 in co-pending U.S. Appl. No. 13/318,181, now published as US Patent Application Publication No. US 2012/0044659.
RCE filed Mar. 10, 2014 in co-pending U.S. Appl. No. 13/320,285, now published as US Patent Application Publication No. US 2012/0055702.
Amendment and Response filed Apr. 16, 2014 in co-pending U.S. Appl. No. 13/319,120 now published as US Patent Application Publication No. US 2012/0061851.
Restriction Requirement mailed Apr. 23, 2014 in co-pending U.S. Appl. No. 13/319,228, now published as US Patent Application Publication No. US 2012/0058653.
Office Action mailed Apr. 24, 2014 in co-pending U.S. Appl. No. 13/700,639, now published as US Patent Application Publication No. 2013/0078860.
Amendment and Response filed Mar. 17, 2014 in co-pending U.S. Appl. No. 13/410,914, now published as US Patent Application Publication No. US 2012/0164888.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Office Action mailed Mar. 20, 2014 in co-pending U.S. Appl. No. 14/058,863, now published as US Patent Application Publication No. 2014/0043782.
Office Action mailed Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due mailed Apr. 17, 2014 in co-pending U.S. Appl. No. 14/058,863, now published as US Patent Application Publication No. 2014/0043782.
Co-pending U.S. Appl. No. 14/254,038 titled High Performance Electrical Connector With Translated Insulator Contact Positioning, filed Apr. 16, 2014.
Office Action mailed Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.
Notice of Non-Compliant Amended mailed Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Office Action mailed Nov. 22, 2013 in co-pending U.S. Appl. No. 13/266,907, now published as US Patent Application Publication No. US 2012/0268155.
Restriction Requirement mailed Dec. 9, 2013 in co-pending U.S. Appl. No. 13/318,171, now published as US Patent Application Publication No. US 2012/0049877.

(56) References Cited

OTHER PUBLICATIONS

Response to Restriction Requirement filed Dec. 17, 2013 in co-pending U.S. Appl. No. 13/318,171, now published as US Patent Application Publication No. US 2012/0049877.
Restriction Requirement mailed Dec. 9, 2013 in co-pending U.S. Appl. No. 13/318,181, now published as US Patent Application Publication No. US 2012/0044659.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Notice of Allowance mailed Oct. 28, 2013 in co-pending U.S. Appl. No. 13/318,263, now published as US Patent Application Publication No. US 2012/0043667.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Dec. 16, 2013 in co-pending U.S. Appl. No. 13/410,914, now published as US Patent Application Publication No. US 2012/0164888.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Amendment and Response filed Nov. 20, 2013 in co-pending U.S. Appl. No. 13/413,724, now published as US Patent Application Publication No. US 2012/0168948.
Notice of Allowance and Fee(s) Due mailed Dec. 6, 2013 in co-pending U.S. Appl. No. 14/058,863.
Office Action mailed Oct. 7, 2013 in co-pending U.S. Appl. No. 13/969,953, now published as US Patent Application Publication No. US 2013/0330942.
Amendment and Response and Terminal Disclaimer filed Nov. 20, 2013 in co-pending U.S. Appl. No. 13/969,953, now published as US Patent Application Publication No. US 2013/0330942.
Final Office Action mailed Dec. 20, 2013 in co-pending U.S. Appl. No. 13/969,953, now published as US Patent Application Publication No. US 2013/0330942.
Co-pending U.S. Appl. No. 14/058,863 titled Compliant Core Peripheral Lead Semiconductor Socket, filed Oct. 21, 2013.
Co-pending U.S. Appl. No. 14/086,029 titled Compliant Printed Circuit Semiconductor Package, filed Nov. 21, 2013.
Final Office Action mailed Mar. 16, 2015 in co-pending U.S. Appl. No. 13/320,285, now published as US Patent Application Publication No. US 2012/0055702.
Final Office Action mailed Feb. 10, 2015 in co-pending U.S. Appl. No. 13/318,382, now published as US Patent Application Publication No. US 2012/0043130.
Amendment and Response with RCE filed Feb. 5, 2015 in co-pending U.S. Appl. No. 13/319,158, now published as US Patent Application Publication No. 2012/0051016.

Notice of Allowance and Fee(s) Due mailed Feb. 9, 2015 in co-pending U.S. Appl. No. 13/643,436, now published as US Patent Application Publication No. 2013/0105984.
Restriction Requirement mailed Feb. 12, 2015 in co-pending U.S. Appl. No. 13/700,639, now published as US Patent Application Publication No. 2013/0078860.
Response to Restriction Requirement filed Feb. 24, 2015 in co-pending U.S. Appl. No. 13/700,639, now published as US Patent Application Publication No. 2013/0078860.
Amendment and Response filed Feb. 3, 2015 in co-pending U.S. Appl. No. 13/879,783, now published as US Patent Application Publication No. 2013/0223034.
Amendment and Response filed Mar. 10, 2015 in co-pending U.S. Appl. No. 13/879,883, now published as US Patent Application Publication No. 2013/0244490.
Restriction Requirement mailed Jan. 22, 2015 in co-pending U.S. Appl. No. 13/880,231, now published as US Patent Application Publication No. 2013/0210276.
Response to Restriction Requirement filed Jan. 27, 2015 in co-pending U.S. Appl. No. 13/880,231, now published as US Patent Application Publication No. 2013/0210276.
Office Action mailed Feb. 27, 2015 in co-pending U.S. Appl. No. 13/410,943, now published as US Patent Application Publication No. US 2012/0161317.
Amendment and Response with RCE filed Jan. 28, 2015 in co-pending U.S. Appl. No. 13/418,853, now published as US Patent Application Publication No. US 2012/0244728.
Office Action mailed Feb. 20, 2015 in co-pending U.S. Appl. No. 13/418,853, now published as US Patent Application Publication No. US 2012/0244728.
Co-pending U.S. Appl. No. 14/621,663 titled High Performance Surface Mount Electrical Interconnect, filed Feb. 13, 2015.
Amendment and Response filed Jan. 3, 2014 in co-pending U.S. Appl. No. 13/266,907, now published as US Patent Application Publication No. US 2012/0268155.
Supplemental Amendment and Response filed Jan. 29, 2014 in co-pending U.S. Appl. No. 13/266,907, now published as US Patent Application Publication No. US 2012/0268155.
Office Action mailed Jan. 3, 2014 in co-pending U.S. Appl. No. 13/318,038, now published as US Patent Application Publication No. US 2012/0062270.
Office Action mailed Feb. 14, 2014 in co-pending U.S. Appl. No. 13/318,171, now published as US Patent Application Publication No. US 2012/0049877.
Amendment and Response filed Feb. 26, 2014 in co-pending U.S. Appl. No. 13/318,171, now published as US Patent Application Publication No. US 2012/0049877.
Response Restriction Requirement filed Jan. 28, 2014 in co-pending U.S. Appl. No. 13/318,181, now published as US Patent Application Publication No. US 2012/0044659.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Final Office Action mailed Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.
Advisory Action mailed Feb. 26, 2014 in co-pending U.S. Appl. No. 13/320,285, now published as US Patent Application Publication No. US 2012/0055702.
Office Action mailed Jan. 17, 2014 in co-pending U.S. Appl. No. 13/319,120 now published as US Patent Application Publication No. US 2012/0061851.
Office Action mailed Dec. 26, 2013 in co-pending U.S. Appl. No. 13/319,145, now published as US Patent Application Publication No. 2012/0049342.

(56) References Cited

OTHER PUBLICATIONS

Restriction Requirement mailed Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Office Action mailed Feb. 27, 2014 in co-pending U.S. Appl. No. 13/319,203, now published as US Patent Application Publication No. 2012/0056640.
Restriction Requirement mailed Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.
Office Action mailed Mar. 4, 2014 in co-pending U.S. Appl. No. 13/575,368, now published as US Patent Application Publication No. 2013/0203273.
Notice of Allowance and Fee(s) Due mailed Feb. 26, 2014 in co-pending U.S. Appl. No. 13/412,870, now published as US Patent Application Publication No. US 2012/0171907.
Final Office Action mailed Feb. 14, 2014 in co-pending U.S. Appl. No. 13/413,724, now published as US Patent Application Publication No. US 2012/0168948.
Amendment and Response to Final Office filed Feb. 26, 2014 in co-pending U.S. Appl. No. 13/413,724, now published as US Patent Application Publication No. US 2012/0168948.
Amendment and Response to Final Office filed Dec. 30, 2013 in co-pending U.S. Appl. No. 13/969,953, now published as US Patent Application Publication No. US 2013/0330942.
Notice of Allowance and Fee(s) Due mailed Jan. 22, 2014 in co-pending U.S. Appl. No. 13/969,953, now published as US Patent Application Publication No. US 2013/0330942.
Co-pending U.S. Appl. No. 14/238,638 titled Direct Metalization of Electrical Circuit Structure, filed Feb. 12, 2014.
Final Office Action mailed May 15, 2014 in co-pending U.S. Appl. No. 13/266,486, now published as US Patent Application Publication No. US 2012/0055701.
Notice of Allowance and Fee(s) Due mailed May 2, 2014 in co-pending U.S. Appl. No. 13/266,522, now published as US Patent Application Publication No. 2012/0068727.
Final Office Action mailed May 7, 2014 in co-pending U.S. Appl. No. 13/266,907, now published as US Patent Application Publication No. US 2012/0268155.
Amendment and Response filed Mar. 18, 2014 in co-pending U.S. Appl. No. 13/319,145, now published as US Patent Application Publication No. 2012/0049342.
Office Action mailed Jun. 27, 2014 in co-pending U.S. Appl. No. 13/319,158, now published as US Patent Application Publication No. 2012/0051016.
Amendment and Response file Jun. 10, 2014 in co-pending U.S. Appl. No. 13/319,203, now published as US Patent Application Publication No. 2012/0056640.
Response to Restriction Requirement filed Jun. 23, 2014 in co-pending U.S. Appl. No. 13/319,228, now published as US Patent Application Publication No. US 2012/0058653.
Restriction Requirement mailed Jun. 5, 2014 in co-pending U.S. Appl. No. 13/879,783, now published as US Patent Application Publication No. 2013/0223034.
Final Office Action mailed Jun. 4, 2014 in co-pending U.S. Appl. No. 13/410,914, now published as US Patent Application Publication No. US 2012/0164888.
Notice of Allowance and Fee(s) Due mailed May 9, 2014 in co-pending U.S. Appl. No. 13/413,724, now published as US Patent Application Publication No. US 2012/0168948.
Response to Restriction Requirement filed Apr. 23, 2014 in co-pending U.S. Appl. No. 13/418,853, now published as US Patent Application Publication No. US 2012/0244728.
Office Action mailed Jun. 26, 2014 in co-pending U.S. Appl. No. 13/418,853, now published as US Patent Application Publication No. US 2012/0244728.

\* cited by examiner

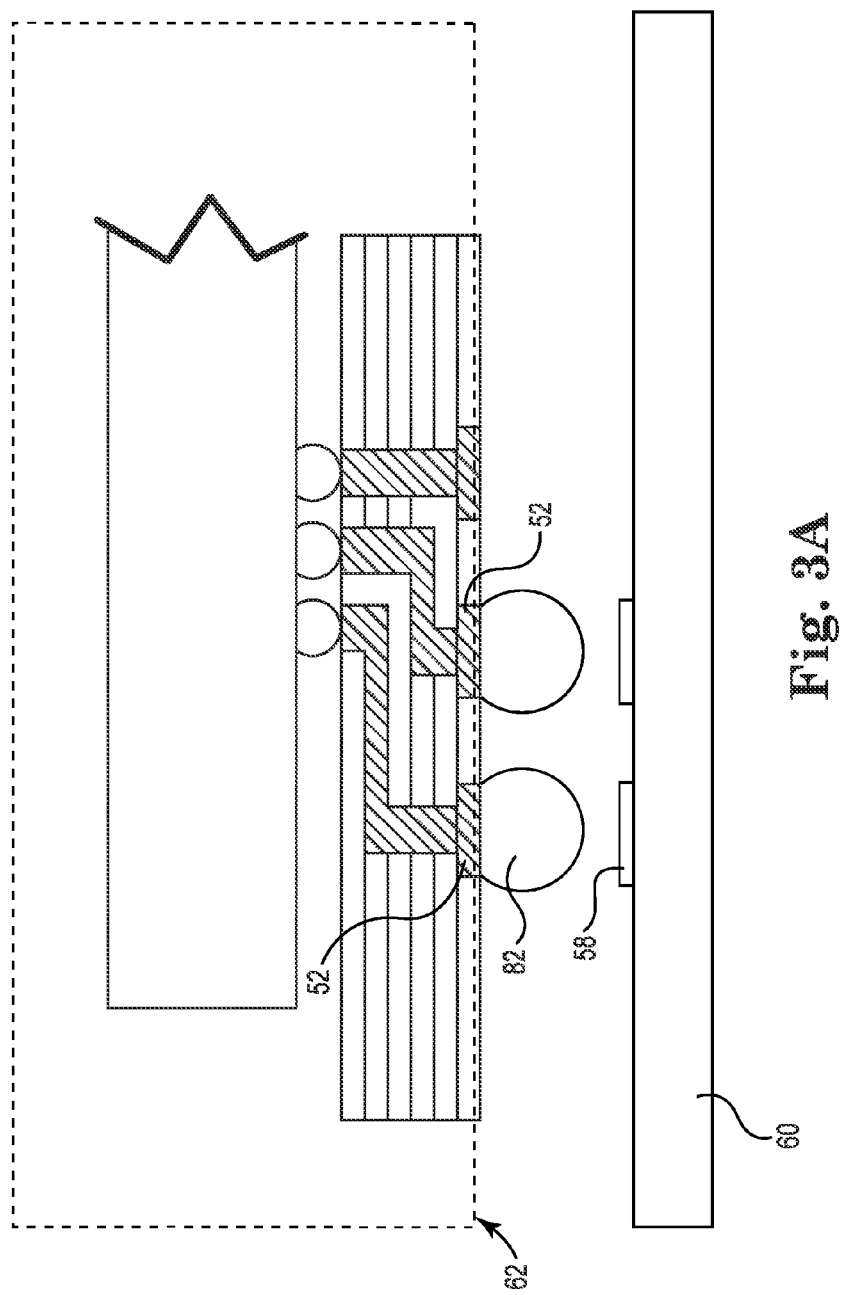

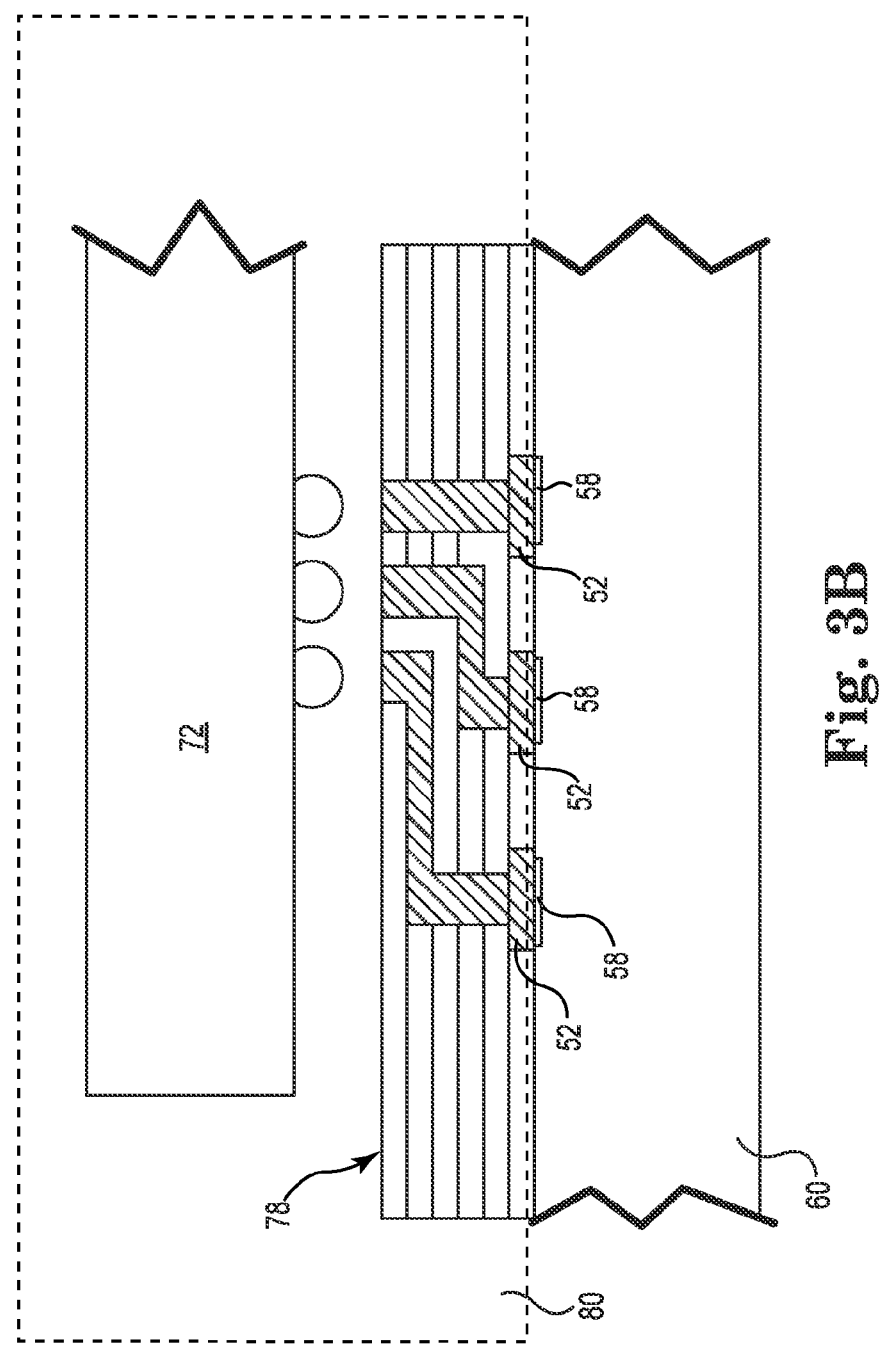

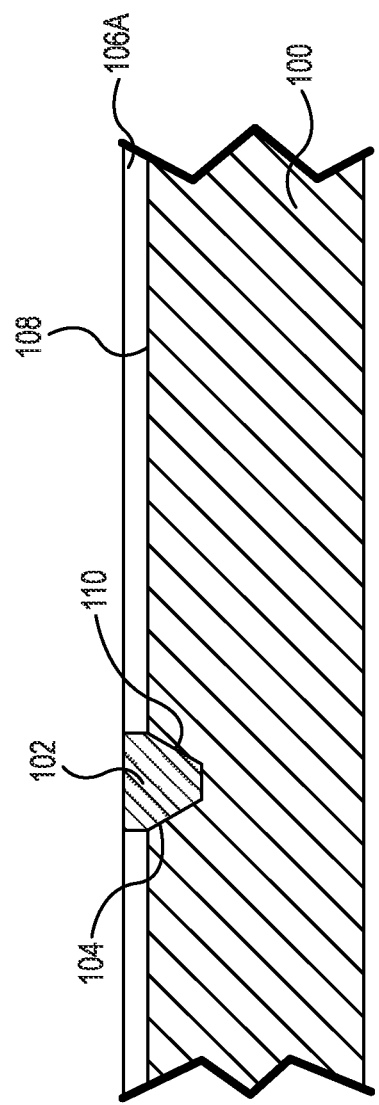

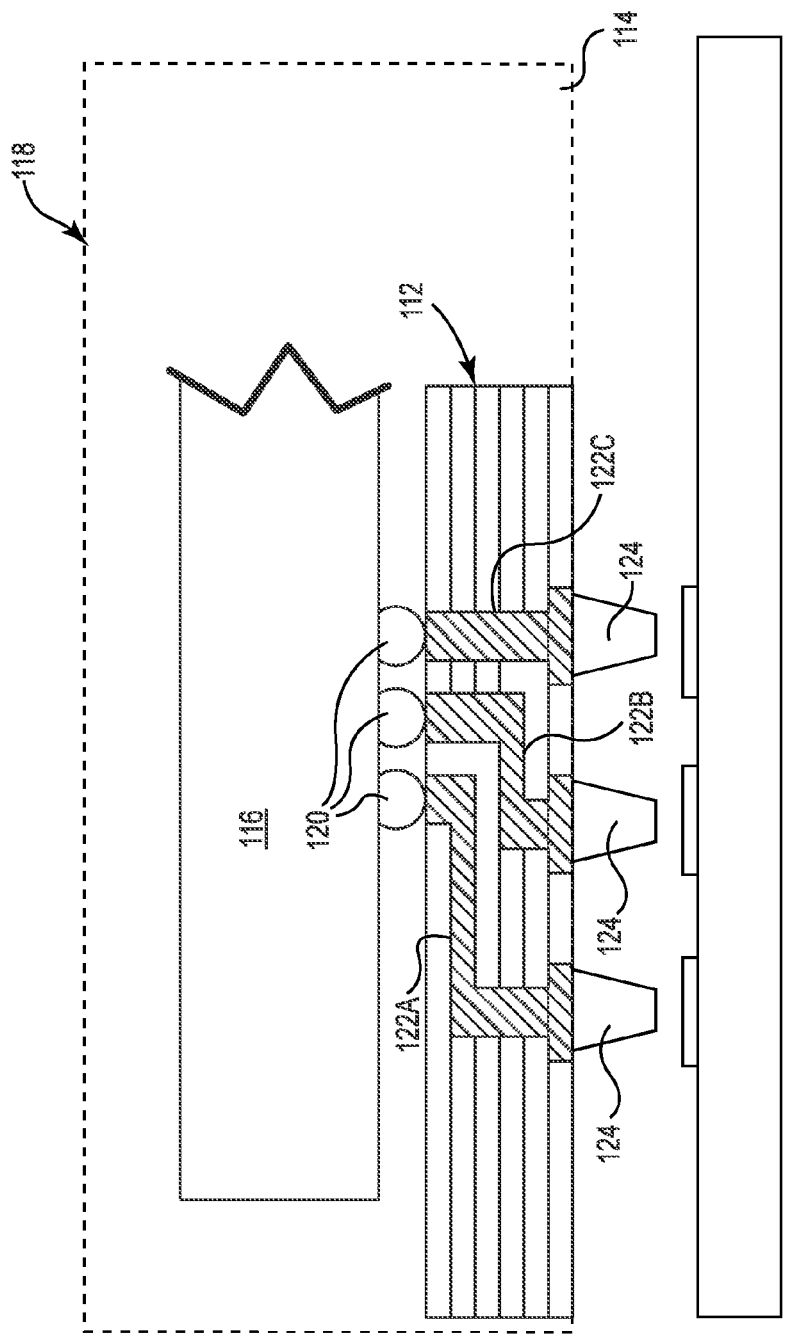

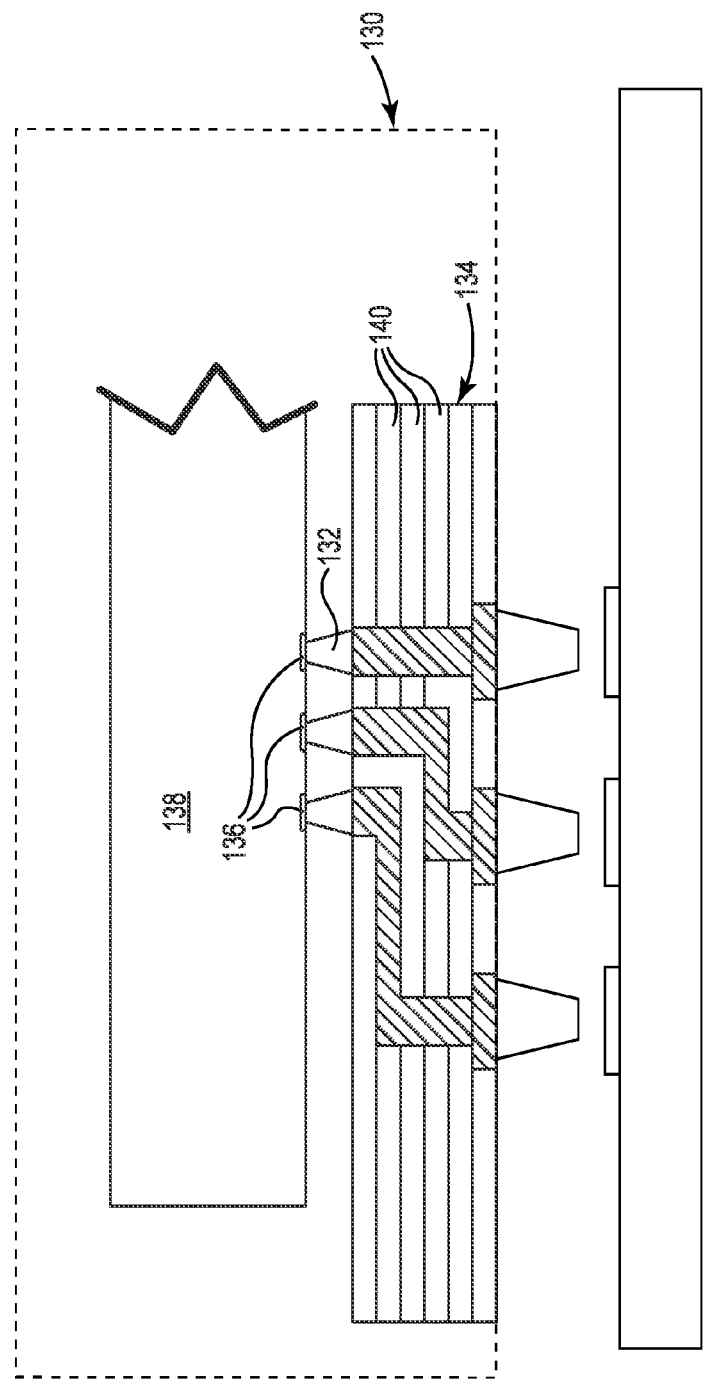

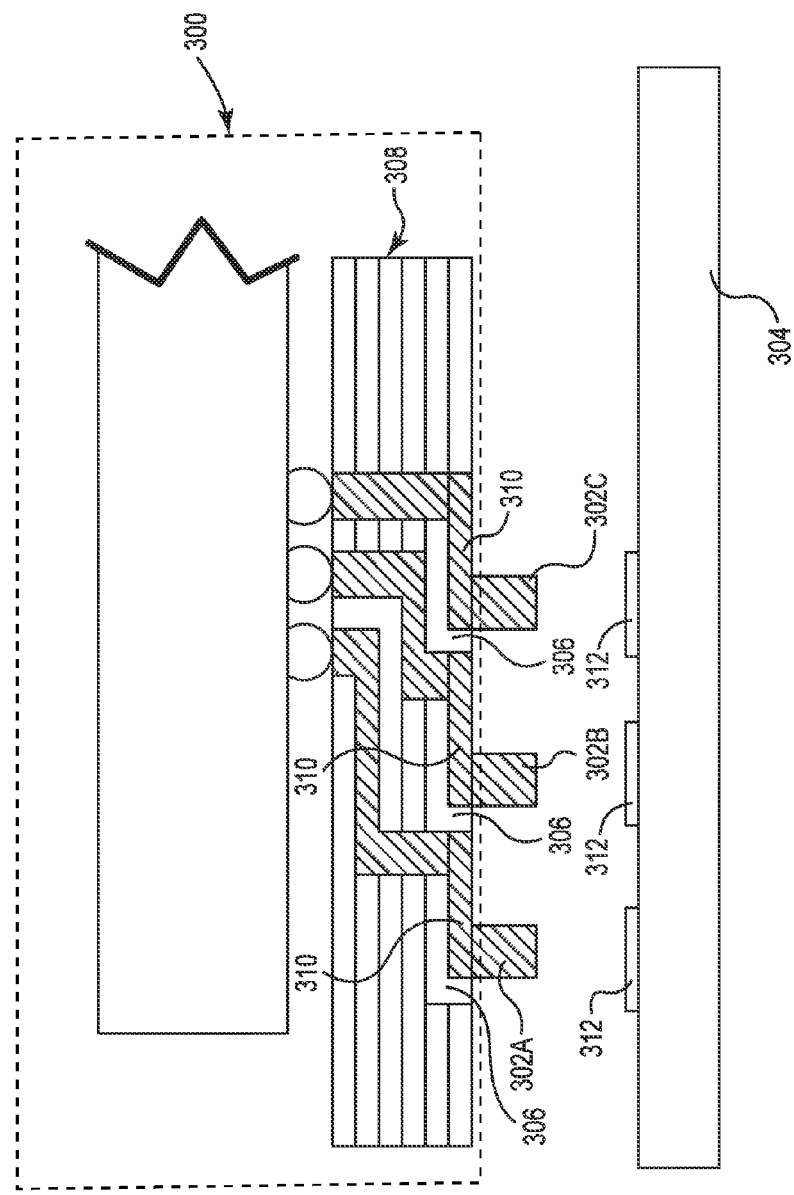

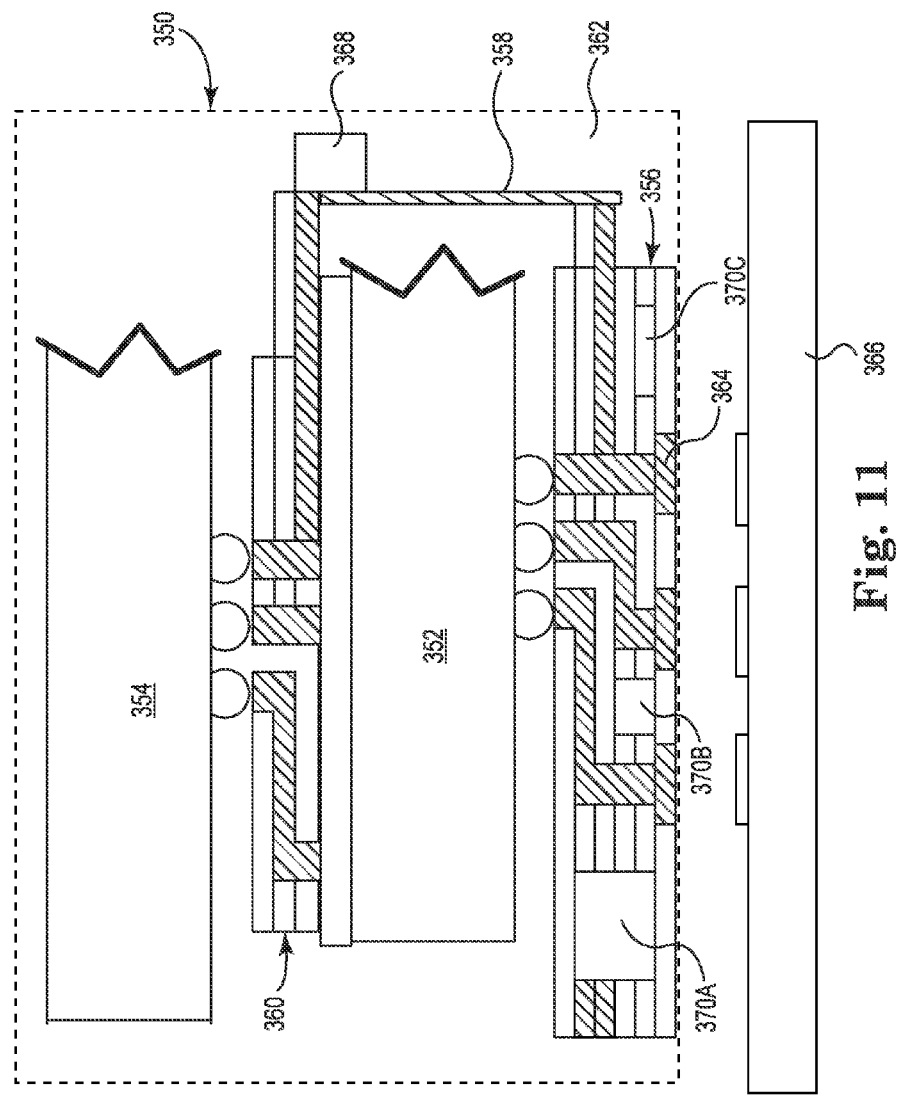

COMPLIANT PRINTED CIRCUIT AREA ARRAY SEMICONDUCTOR DEVICE PACKAGE

CROSS-REFERENCE TO RELATED APPLICATIONS

This application is a national stage application under 35 U.S.C. §371 of International Application No. PCT/US2010/036363, titled COMPLIANT PRINTED CIRCUIT AREA ARRAY SEMICONDUCTOR DEVICE PACKAGE, filed May 27, 2010, which claims priority to U.S. Provisional Application No. 61/183,411, filed Jun. 2, 2009, both of which are hereby incorporated by reference in their entireties.

TECHNICAL FIELD

The present disclosure relates to a compliant array integrated circuit (IC) device package, and in particular, to a compliant IC device package made using an additive printing process.

BACKGROUND OF THE INVENTION

Traditional semiconductors and IC devices are typically formed on a substrate using photolithography. The substrate may be a silicon wafer. Multiple IC devices are typically formed on a single wafer and then the wafer is cut into die. The IC devices are typically packaged in a variety of ways to provide redistribution from the terminals on the die to a spacing that is conducive to cost effective printed circuit board (PCB) fabrication techniques. The package also serves to protect the fragile silicon or provide additional functions such as thermal management or near device decoupling. In many cases, the size and distance between die terminals is so small that the IC device cannot be connected to the final PCB without some sort of re-routing interface. In such cases, the package can provide the re-routing interface.

Most IC devices are produced with terminals in either a peripheral pattern that runs along the edges of the IC device or an area array pattern that spans across the surface of the IC device. A main method for attachment when the terminals are in an area array pattern is to connect the terminals with solder. Basically, the package has an array of terminals that correspond to the IC device terminals. Solder is applied to the terminals on the IC device and/or the package and reflowed to create the mechanical and electrical connection in a process commonly called flip chip attachment. In a flip chip attachment the IC device is flipped over to mate the terminals on the die to the terminals on the IC package substrate.

After an IC device is positioned in this type of package and attached to the package terminals, the package is often under filled with an epoxy of some type to provide support and strength to the solder joints. The epoxy protects the solder joints from thermal expansion, miss-match and/or shock during use. Regardless of whether a package is under filled with epoxy, the connection of the IC device to the package is generally not reworkable after packaging, and if there is a missing or broken connection it is difficult to repair.

Once the IC devices are packaged, the IC devices are usually tested in a variety of ways to determine the reliability and performance of the IC devices in the package. The IC devices may be tested as they would be used in a final application. In many cases, the functional performance of the IC device is not known prior to placing it into the package. If the packaged IC device fails testing then the cost of the package and manufacturing process is lost.

Area array packaging has been utilized for many years, and provides a method for interconnecting IC devices with larger terminal counts than peripheral lead packaging. In general, the area array packaging is more expensive due to the larger pin counts and more sophisticated substrates required. The limitations for area array packaging include the terminal pitch, thermal management, cost, ability to rework faulty IC devices and reliability of the solder joints.

There also has been advancements in recent years in both area array packaging and peripheral lead packaging where multiple IC devices are placed in the same package, creating what has been nicknamed SiP for "system in package." Placing multiple IC devices in a single package further complicates the problems discussed above.

BRIEF SUMMARY OF THE INVENTION

The present application relates to a compliant array IC device package (IC package). The present IC package is inexpensive to produce, has relative long life and provides excellent electrical performance.

The present disclosure can leverage the capabilities of the additive printing process to provide a high performance IC package capable of interconnecting a single device or multiple IC devices, while providing at or near terminal compliance to increase interconnect reliability. The unique nature of the additive printing process allows for a direct writing of circuitry and dielectrics, with the added benefit of stress decoupling at the terminal joints as well as embedded function not seen in traditional IC packaging. The additive printing process allows for packaging that provides very high frequency performance, as well as the addition of on-board electrical devices and circuitry planes that are not available with other IC packages.

The use of additive printing processes permits the material set in a given layer to vary. Traditional PCB and circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

The production cost for the IC packages in accordance with the present disclosure can be a fraction the cost of producing existing IC packages. The use of additive printing processes, such as for example to print electrical features, can reduce capital cost and lead time for building the present IC packages. The additive printing processes also increase production yields over conventional IC packages that rely on conventional lithography tools and masks.

Internal compliance of the interconnect assembly in the present IC package can greatly increase performance over conventional IC packages. The ability to build multi-layer structures over a relatively large area permits terminal pitch on the IC devices to be reduced. The addition of circuitry planes and electrical devices in the present IC package provides performance enhancements not available with current IC packages. The ability to add electrical devices, such as transistors and memory, to the present IC package provides the opportunity to incorporate intelligence directly into the package.

One embodiment of the present disclosure is directed to an IC package for an IC device. The IC package can include an interconnect assembly with at least one printed compliant layer, a plurality of first contact members located along a first major surface, a plurality of second contact members located along a second major surface, and a plurality of printed conductive traces electrically coupling a plurality of the first and second contact members. The compliant layer can be positioned to bias at least the first contact members against terminals on the IC device. Packaging may substantially surround the IC device and the interconnect assembly. The second contact members are accessible from outside the packaging.

The resulting circuit geometry preferably has conductive traces that have substantially rectangular cross-sectional shapes, corresponding to recesses or cavities in one or more previously applied layers. The use of additive printing processes permit conductive material, non-conductive material, and semi-conductive material to be located on a single layer.

In one embodiment, pre-formed conductive trace materials are positioned in the cavities. The cavities are than plated to form conductive traces with substantially rectangular cross-sectional shapes. In another embodiment, a conductive foil is pressed into at least a portion of the cavities. The conductive foil is sheared along edges of the cavities. The excess conductive foil not positioned in the cavities is removed and the cavities are plated to form conductive traces with substantially rectangular cross-sectional shapes.

The interconnect assembly can typically include a plurality of printed dielectric layers. The interconnect assembly can optionally include at least one additional circuitry plane. The additional circuitry plane can be one of a ground plane, a power plane, an electrical connection to other circuit members, a dielectric layer, or a flexible circuit. The contact members may typically be made from one of a curable conductive material, sintered conductive particles, or a platable material.

In one embodiment, the interconnect assembly extends beyond a perimeter edge of the IC package. In another embodiment, a flexible circuit member is electrically coupled to the interconnect assembly and extends beyond a perimeter edge of the IC package.

At least one electrical device can be optionally printed on the interconnect assembly and electrically coupled to one or more of the conductive traces. The electrical device can be selected from one of shielding, near device decoupling, capacitors, transistors, resistors, filters, signal or power altering and enhancing devices, memory devices, embedded ICs, RF antennae, and the like. In another embodiment, at least one electrical device can be printed on the packaging.

The packaging can include one or more of a preformed package, an encapsulating material, or a combination thereof.

The present disclosure is also directed to an IC package, including an interconnect assembly in accordance with one of the embodiments of the present disclosure. Terminals on at least one IC device can be compressively engaged with the first contact members so the compliant layer biases the first contact members against the terminals on the IC device. Packaging substantially surrounds the IC device and the interconnect assembly so the second contact members can be accessible from outside the packaging.

In one embodiment, a plurality of IC devices are electrically coupled to the interconnect assembly. In another embodiment, a plurality of interconnect assemblies can be electrically coupled to one or more of the second contact members and a plurality of IC devices are each electrically coupled to one of the interconnect assemblies.

The present disclosure is also directed to an electrical system including an IC package in accordance with one of the embodiments of the present disclosure and a PCB electrically coupled with the second contact members.

The present disclosure is also directed to a method of making an IC package. An interconnect assembly can be formed by printing at least one dielectric layer onto a surface of a fixture, depositing a conductive material comprising first contact members, printing a compliant layer along at least the first contact members, and printing a plurality of conductive traces electrically coupled with one or more of the first contact members. A plurality of second contact members can be formed along a second major surface of the interconnect assembly. The interconnect assembly can be removed from the fixture. Terminals on at least one IC device can be compressively engaged with the first contact members. The compliant layer can bias the first contact members against the terminals on the IC device. The IC device and the interconnect assembly can be substantially surrounded by packaging. The second contact members can be accessible from outside the packaging.

In one embodiment, conductive material can be deposited into a plurality of the cavities in the fixture. The conductive material can be deposited using for example inkjet printing technology, aerosol printing technology, and other maskless deposition techniques. The conductive material can be processed to form the plurality of contact members along the first and second major surfaces of the interconnect assembly.

In another embodiment, a second base layer of a dielectric material can be printed onto a surface of a fixture using for example inkjet printing technology, aerosol printing technology, and other maskless deposition techniques. A conductive material can be deposited into a plurality of the cavities in the fixture. The conductive material can be processed to form a plurality of second contact members. The second contact members can be electrically coupled with the conductive traces on the interconnect assembly so the second contact members extend along the second major surface of the interconnect assembly.

The method can include forming at least one additional circuitry plane in the interconnect assembly. The method can optionally include electrically coupling a flexible circuit member to the interconnect assembly and extending the flexible circuit member beyond a perimeter edge of the packaging. At least one electrical devices can be optionally printed on the interconnect assembly.

The present method is also directed to making an electrical assembly comprising the step of electrically coupling the second contact members on an IC package according to the present disclosure with a PCB.

BRIEF DESCRIPTION OF THE SEVERAL VIEWS OF THE DRAWING

FIG. 3A is a cross-sectional view of an IC package with a ball grid array (BGA) interface in accordance with an embodiment of the present disclosure.

FIG. 3B is a cross-sectional view of an IC package printed directly on another circuit member in accordance with an embodiment of the present disclosure.

FIG. 4 is a cross-sectional view of an alternate fixture for making an IC package in accordance with an embodiment of the present disclosure.

FIG. 5A is a cross-sectional view of an IC package in accordance with an embodiment of the present disclosure.

FIG. 5B is a cross-sectional view of a solderless IC package in accordance with an embodiment of the present disclosure.

FIGS. 9 and 10 are IC packages with terminal pad extensions in accordance with an embodiment of the present disclosure.

FIG. 11 is an IC package with multiple IC devices in accordance with an embodiment of the present disclosure.

DETAILED DESCRIPTION OF THE INVENTION

Figure 1:
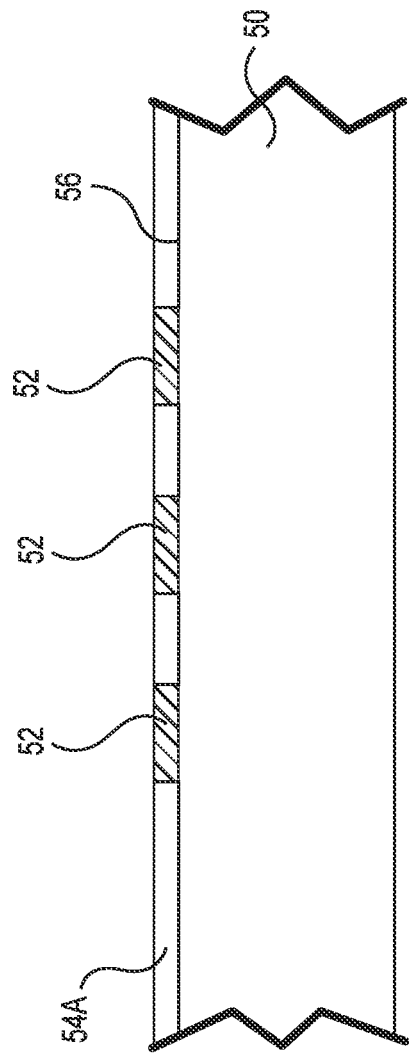
FIG. 1 is a cross-sectional view of a fixture for making an IC package in accordance with an embodiment of the present disclosure.

The present disclosure is directed to a compliant array IC package that is inexpensive to produce, has relative long life and provides excellent electrical performance. An IC package according to the present disclosure can be formed by an additive printing process to provide a high performance IC package capable of interconnecting a single device or multiple IC devices, while providing at or near terminal compliance to increase interconnect reliability. The unique nature of the additive printing process can allow direct writing of circuitry and dielectrics, while also allowing stress decoupling at the terminal joints as well as embedded function not seen in traditional IC packaging.

Printable silicon inks provide the ability to print electrical devices. Exemplary embodiments of printable silicone inks are disclosed, for example, in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. For example, conductive material can be deposited in the cavities using printing technology.

Printing process can preferably be used to fabricate various functional structures, such as conductive paths and electrical devices without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

U.S. Pat. No. 6,506,438 (Duthaler et al.) and U.S. Pat. No. 6,750,473 (Amundson et al.), which are incorporated herein by reference, teach using inkjet printing to make various electrical devices, such as resistors, capacitors, diodes, inductors (or elements which can be used in radio applications or magnetic or electric field transmission of power or data), semiconductor logic elements, electro-optical elements, transistors (including, light emitting, light sensing or solar cell elements, field effect transistors, top gate structures), and the like.

U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference, teach using aerosol printing to create various electrical devices and features.

Printing of electronically active inks can be done on a large class of substrates, without the requirements of standard vacuum processing or etching. The inks may incorporate mechanical, electrical or other properties, such as, conducting, insulating, resistive, magnetic, semiconductive, light modulating, piezoelectric, spin, optoelectronic, thermoelectric or radio frequency.

A plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from Dupont located in Wilminton, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181 (Bridenbaugh et al.), which is incorporated herein by reference.

A protective layer can optionally be printed onto the electrical devices and features. The protective layer can be an aluminum film, a metal oxide coating, a polymeric film, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layer are exemplary only. Other suitable materials known to those skilled in the art having properties similar to those described above can be used in accordance with the present invention.

An inkjet print head, or other print head, preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head can be used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electropneumatic, electrostatic, rapid ink heating, magnetohydrodynamic, or any other technique well known to those skilled in the art. The deposited ink patterns typically undergo a curing step or another processing step before subsequent layers are applied.

The use of additive printing processes permits the material set in a given layer to vary. Traditional PCB and circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

While inkjet printing is preferred, the term "printing" is intended to include all forms of printing and coating, including: premetered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; aerosol printing processes; and other similar techniques.

The additive printing process allows for packaging that provides very high frequency performance, as well as the addition of on-board electrical devices and circuitry planes that are not available with other IC packages.

An IC package according to the present disclosure can be used with IC devices having contact-to-contact spacing (pitch) on the order of less than about 1.0 millimeter ($1 \times 10^{-3}$ meters), and more preferably a pitch of less than about 0.7 millimeter, and most preferably a pitch of less than about 0.4 millimeter.

FIG. 1 is a side cross-sectional view of a fixture 50 useful in making an IC package in accordance with an embodiment of the present disclosure. Metallized terminal pads 52 and a dielectric layer 54A can be preferably printed on surface 56 of the fixture 50 using for example inkjet printing technology, aerosol printing technology, and other maskless deposition techniques. The fixture 50 can be constructed from a variety of materials, such as for example metal, plastic, ceramics, and composites thereof. The surface 56 can be optionally coated with a material to facilitate release of the layer 54A and the terminal pads 52.

Although the terminal pads 52 are configured for use in a land grid array interface, the present printing process permits the terminal pads 52 to be configured to electrically couple with a wide variety of circuit members, including for example a flexible circuit, a ribbon connector, a cable, a printed circuit board (PCB), a ball grid array (BGA), a land grid array (LGA), a plastic leaded chip carrier (PLCC), a pin grid array (PGA), a small outline integrated circuit (SOIL), a dual in-line package (DIP), a quad flat package (QFP), a leadless chip carrier (LCC), a chip scale package (CSP), or packaged or unpackaged integrated circuits. See for example the fixture 100 in FIG. 4.

Figure 2:
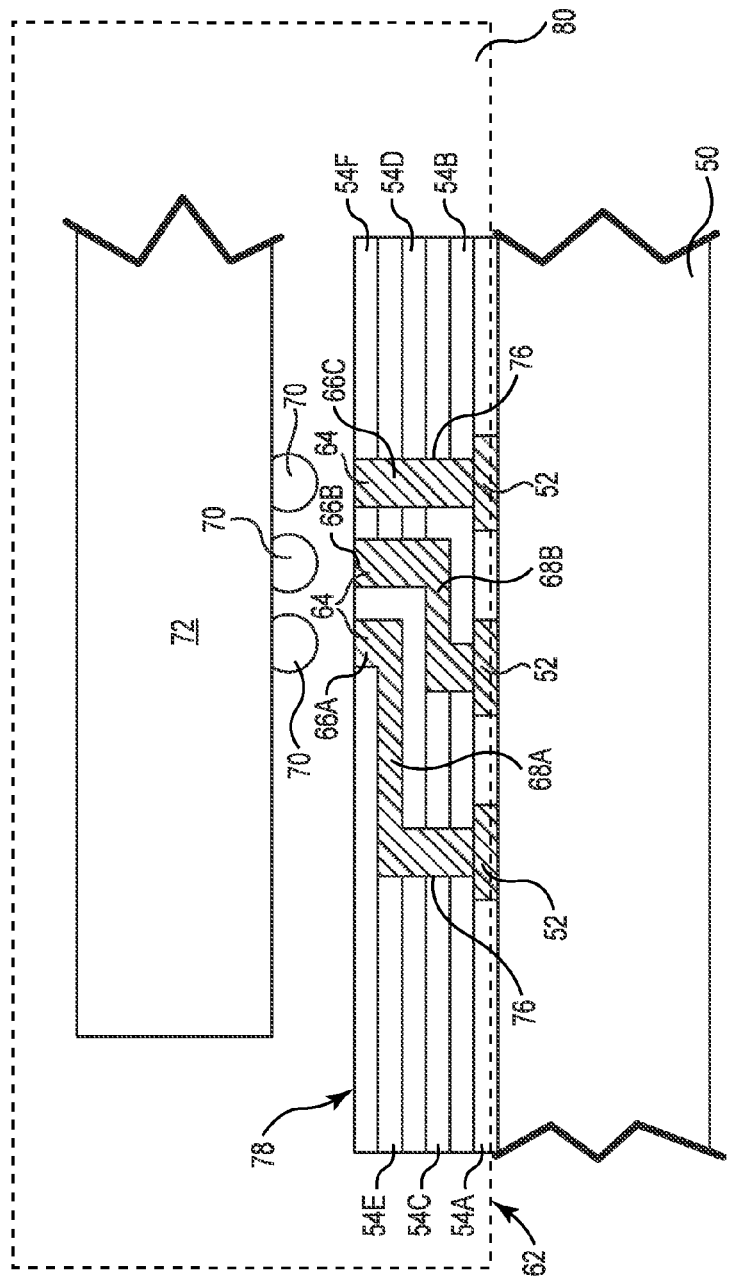
FIG. 2 is a cross-sectional view of an IC package in accordance with an embodiment of the present disclosure.

FIG. 2 is a cross-sectional view of an IC package 62, according to one embodiment of the present disclosure. As shown in FIG. 2, additional dielectric layers 54B, 54C, 54D, 54E, 54F (collectively "54") can be printed on the fixture 50 along with conductive material 64 forming contact members 66A, 66B, 66C (collectively "66") to complete interconnect assembly 78. In one embodiment, the dielectric layers 54 are printed to create cavities 76 or recesses at the desired locations for depositing conductive material 64. The conductive material 64 may be, for example, a metallic powder that can be sintered to create contact members 66 or a flowable, curable conductive material.

The conductive material 64 is preferably deposited in a first state and then processed to create a second more permanent state. For example, metallic powder can be deposited in the cavities 76 and subsequently sintered, or curable conductive material can flow into the cavities 76 and subsequently cured. As used herein "cure" and inflections thereof refers to a chemical-physical transformation that allows a material to progress from a first form (e.g., flowable form) to a more permanent second form. The term "curable" refers to a characteristic of a material having the potential to be cured, such as for example by the application of a suitable energy source.

In the illustrated embodiment, conductive traces 68A, 68B route the contact members 66A and 66B to correspond to the terminals 70 on the IC device 72. The terminal pads 52 are arranged in an array that corresponds to contact pads 58 on a circuit member 60 to which the IC package 62 will be attached (see e.g., FIG. 3A). Various methods for deposition of electronic materials may also be used to deposit the conductive material 64 in the cavities 76 or to print the dielectric layers 54, such as for example, screen printing, printing through a stencil, flexo-gravure printing, offset printing, ink-jet printing, and aerosol printing as previously explained.

The cavities 76 in the layers 54 permit control of the location, cross section, material content, and aspect ratio of the contact members 66 and the conductive traces 68. Maintaining the conductive traces 68 with a cross-section of 1:1 or greater provides greater signal integrity than traditional subtractive trace forming technologies. For example, traditional methods take a sheet of a given thickness and etches the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the cavities 76 to control the aspect ratio of the conductive traces 68 can result in a more rectangular or square cross-section of the conductive traces, and a corresponding improvement in signal integrity.

In another embodiment, pre-patterned or pre-etched thin conductive foil circuit traces are transferred to recesses or trenches in the layers 54. For example, a pressure sensitive adhesive can be used to retain the copper foil circuit traces in the recesses. The trapezoidal cross-sections of the pre-formed conductive foil traces are then post-plated. The plating material fills the open spaces in the recesses not occupied by the foil circuit geometry, resulting in a substantially rectangular or square cross-sectional shape corresponding to the shape of the recesses.

In another embodiment, a thin conductive foil is pressed into the recesses, and the edges of the recesses acts to cut or shear the conductive foil. The process positions a portion of the conductive foil in the recesses, but leaves the negative pattern of the conductive foil not wanted outside and above the recesses for easy removal. Again, the foil in the recesses are preferably post plated to add material to increase the thickness of the conductive traces and to fill any voids left between the conductive foil and the recesses.

In one embodiment, some or all of the dielectric layers 54 are a compliant material that provides the contact members 66 with a degree of compliance. In one embodiment, solder balls 70 are coupled to the IC device, but are not reflowed, and an electrical connection is formed by compressive forces. The compliant layers 54 bias the contact members 66 into engagement with the solder balls 70.

The interconnect assembly 78 and the IC device 72 are then enclosed in packaging 80. The packaging 80 can be a pre-formed structure, such as for example a plastic or ceramic substrate, an encapsulating material, or a combination thereof. In one embodiment, the packaging 80 is a curable material printed using the printing technology discussed herein. In another embodiment, the interconnect assembly 78 and IC device 72 are encapsulated in an epoxy material. The packaging 80 can be completed before or after the interconnect assembly 78 is removed from the fixture 50.

FIG. 3A is a cross-sectional view of an IC package with a BGA interface in accordance with an embodiment of the present disclosure. FIG. 3A illustrates the IC package 62 removed from the fixture 50 (shown in FIG. 2). In the illustrated embodiment, solder balls 82 are attached to terminal pads 52. The solder 82 is preferably reflowed to electrically couple with contact pads 58 on a circuit member 60. The circuit member 60 can be another packaged integrated circuit device, an unpackaged integrated circuit device, a printed circuit board, a flexible circuit, a bare-die device, an organic or inorganic substrate, a rigid circuit, or any other device capable of carrying electrical current. In another embodiment, the solder balls 82 are omitted and the IC package 62 is used in an LGA configuration.

FIG. 3B is a cross-sectional view of an IC package printed directly on another circuit member in accordance with an embodiment of the present disclosure As shown in FIG. 3B, a circuit member 60 can be substituted for fixture 50 during the process of forming the IC package. The interconnect assembly 78 can be formed directly on the circuit member 60, such as for example a PCB. The terminal pads 52 can be formed directly on the contact pads 58. The packaging 80 can be applied directly to the interconnect assembly 78 and IC device 72, sealing and attaching the interconnect assembly 78 directly to the printed circuit board 60. In one embodiment, the functionality of the IC device 72 may be tested before the packaging 80 is applied.

FIG. 4 is a cross-sectional view of an alternate fixture 100 for making an IC package in accordance with an embodiment of the present disclosure. Conductive material 102 can be deposited in cavities 104 or recesses either before or after application of a dielectric layer 106A. The cavities 104 can be formed using a variety of techniques, such as molding, machining, printing, imprinting, embossing, etching, coining, and the like. Although the cavities 104 are illustrated as truncated cones or pyramids, a variety of other shapes can be used, such as for example, cones, hemispherical shapes, and the like.

In one embodiment, the dielectric layer 106A is printed onto surface 108, while leaving the cavities 104 exposed. In another embodiment, the dielectric layer 106A is applied to the surface 108 before the cavities 104 are formed, and the cavities 104 are formed through the dielectric layer 106A. In yet another embodiment, the dielectric layer 106A extends along the surfaces 110 of the cavities 104. The dielectric layer 106A facilitates removal of the interconnect assembly 112 (shown in FIG. 5A) from the fixture 100.

FIG. 5A is a cross-sectional view of an IC package 118 in accordance with an embodiment of the present disclosure. The completed interconnect assembly 112 is shown removed from the fixture 100 and sealed in packaging 114 with an IC device 116 to form the IC package 118. The IC device 116 includes solder balls 120 that are preferably reflowed to electrically couple with contact members 122A, 122B, 122C (collectively "122") on the interconnect assembly 112. The contact members 124 were formed by processing a conductive material. The contact members 124 provide an IC package 118 that is compatible with various sockets. The configuration of the contact members 124 can permit the IC package 118 to be coupled with a socket in a solderless configuration.

FIG. 5B is a cross-sectional view of alternate solderless IC package 130 in accordance with an embodiment of the present disclosure. Rather than having to reflow solder, contact members 132 formed on the interconnect assembly 134 compressively engage with terminals 136 on the IC device 138. Compliant layers 140 bias the contact members 132 into engagement with the terminal 136. The compliant layers 140 also permit the contact members 132 to deflect and compensate for non-planarity of the terminals 136.

Figure 6:
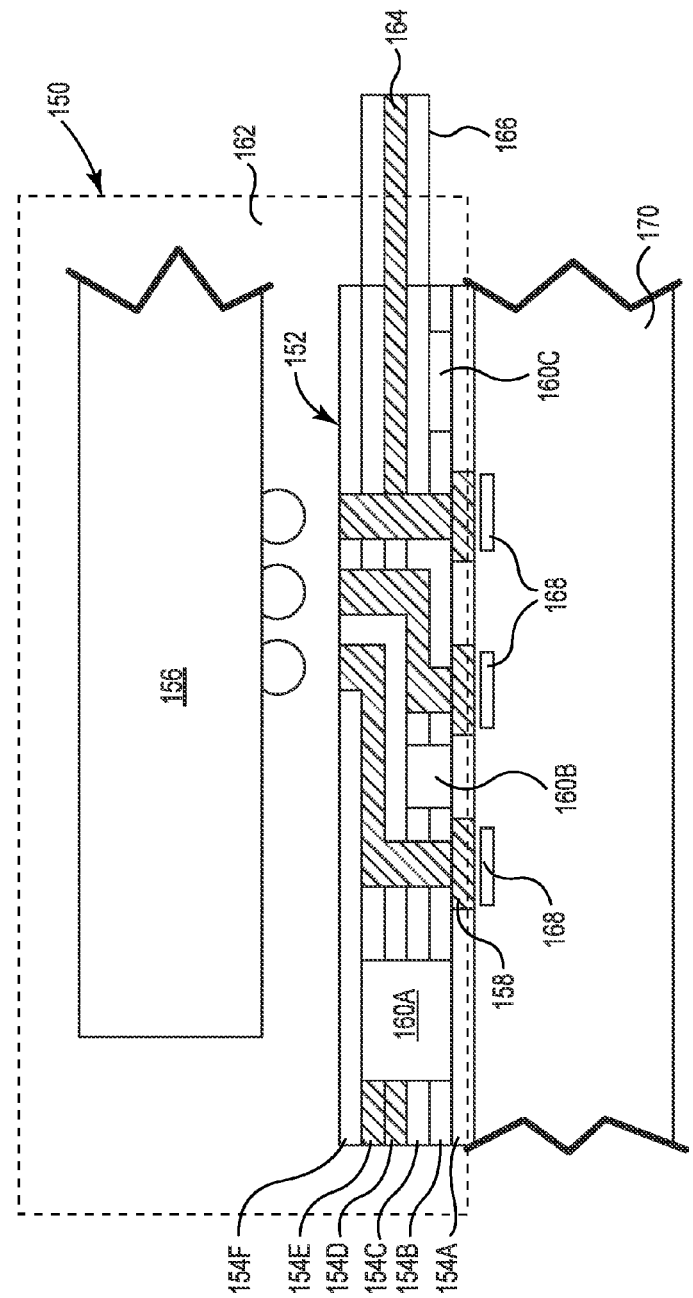
FIG. 6 is a cross-sectional view of an alternate IC package with additional electrical functionality in accordance with an embodiment of the present disclosure.

FIG. 6 is a cross-sectional view of an alternate IC package 150 with additional functionality built into the interconnect assembly 152 in accordance with an embodiment of the present disclosure. One or more of the layers 154A, 154B, 154C, 154D, 154E, 154F (collectively "154") can include additional functionality, such as for example, specialty dielectrics, ground planes, power planes, shielding layers, stiffening layers, capacitive coupling features, circuitry layers, and the like. The close proximity of the layers 154 to the IC device 156 can improve electrical performance.

The additional functionality can also be provided by additional electrical devices 160A, 160B, and 160C (collectively "160"). The additional electrical devices 160 can be shielding, near device decoupling, capacitors, transistors, resistors, filters, signal or power altering and enhancing devices, memory devices, embedded IC, RF antennae, and the like. The electrical devices 160 can include passive or active functional elements. Passive functional elements may refer to structures having a desired electrical magnetic, or other property, including but not limited to a conductor, resistor, capacitor, inductor, insulator, dielectric, suppressor, filter, varistor, ferromagnet, and the like.

The electrical devices 160 can be added as discrete components or printed onto one of the layers 154. In a preferred embodiment, the electrical devices 160 can be printed onto the interconnect assembly 152. As previously described, the availability of printable inks containing silicon and/or carbon nanotubes provides the ability to print electrical devices 160. Electrical devices that are typically located on a separate IC device or the circuit member 170 can be incorporated into the IC package 150, thereby improving electrical performance.

In the illustrated embodiment, the interconnect assembly 152 extends beyond the packaging 162. Conductive traces 164 permit and extension 166 to connect to other electrical devices, such as for example an external power source, another IC device, a test station, and the like. In the illustrated embodiment, terminal pads 158 form an LGA configuration with contact pads 168 on circuit member 170.

Figure 7:
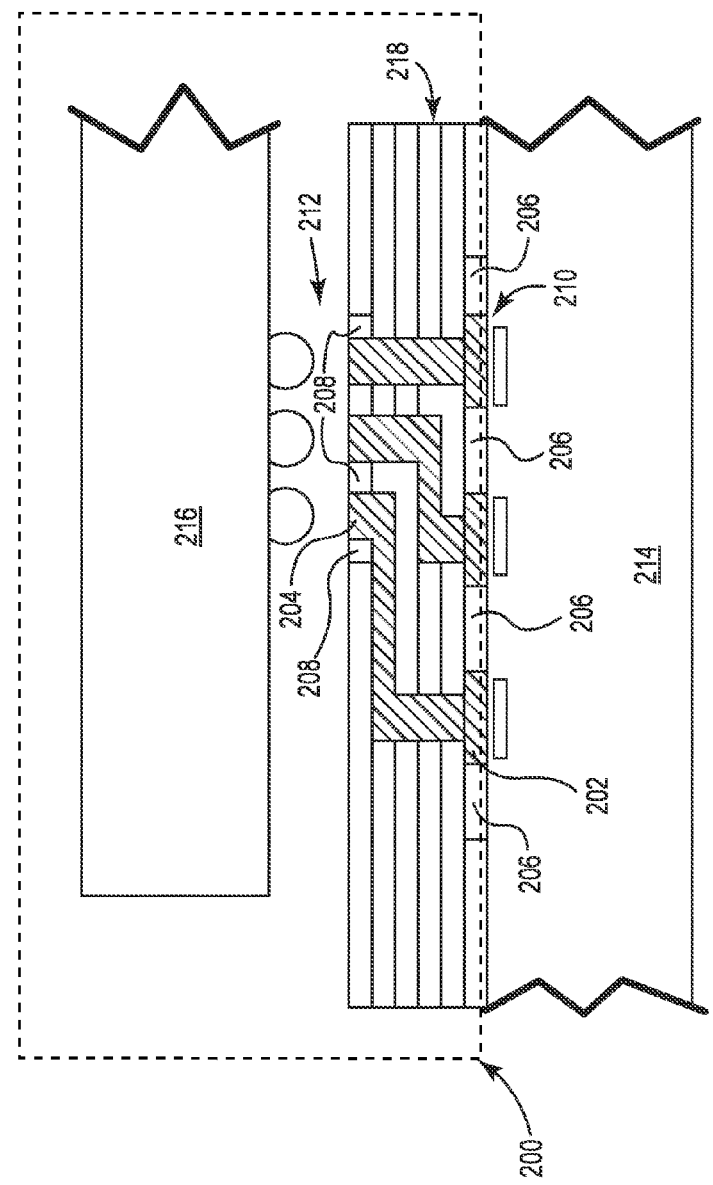
FIGS. 7 and 8 are IC packages with additional compliance in accordance with an embodiment of the present disclosure.
Figure 8:
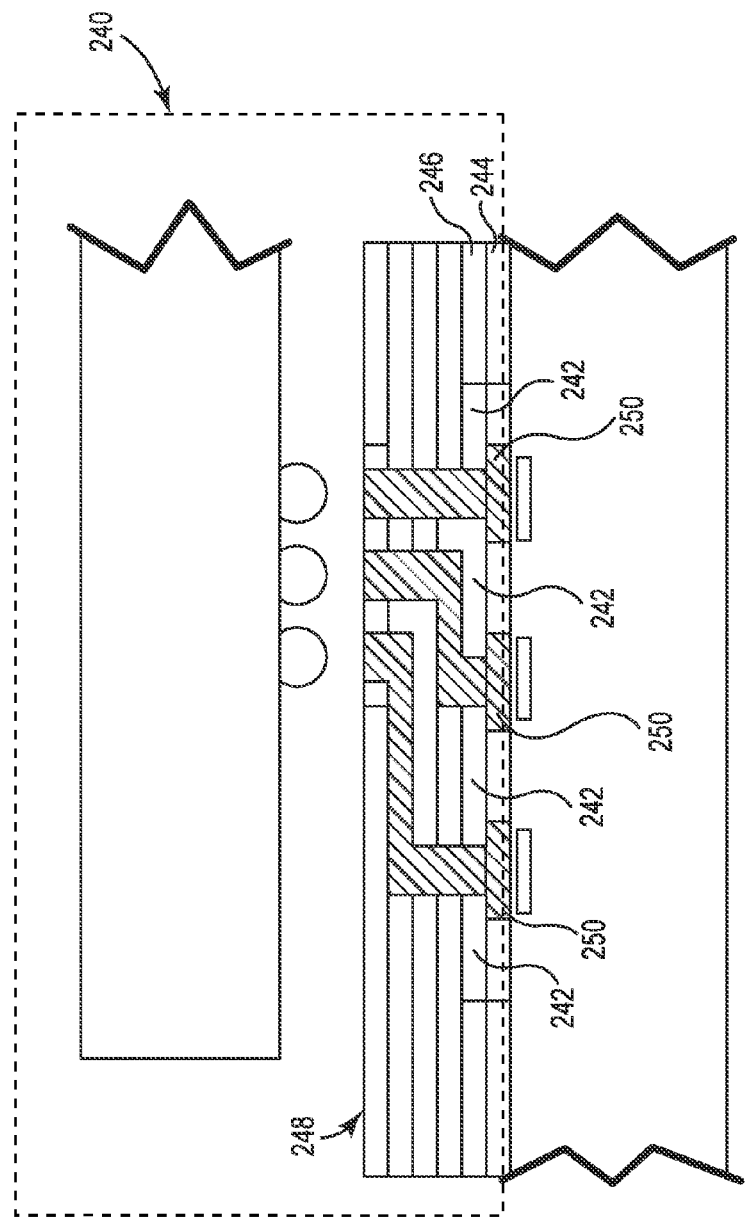

FIG. 7 is an alternate IC package 200 with additional compliance built into the interconnect assembly 218 in accordance with an embodiment of the present disclosure. Compliant material 206 can be printed around terminal pads 202 and compliant material 208 can be printed around terminal pads 204. The additional compliance can assist with decoupling stress at interface 210 with a PCB 214 and the interface 212 with an IC device 216. FIG. 8 is an IC package 240 configured as a variation of the IC package 200 of FIG. 7. In the IC package 240 compliant material 242 extends into the first two layers 244, 246 of the interconnect assembly 248, providing a higher degree of compliance around terminal pads 250.

Figure 9:
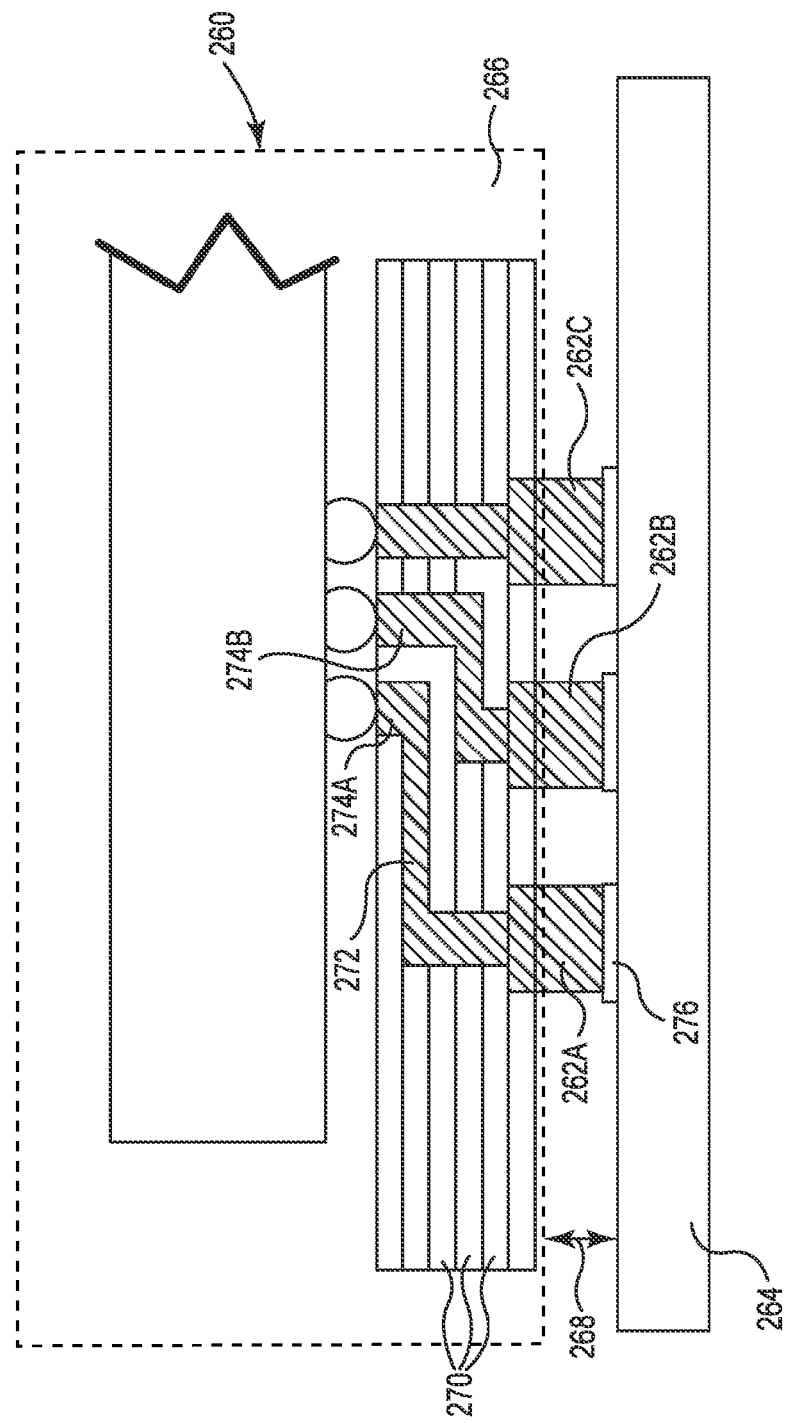

FIG. 9 is an alternate IC package 260 with terminal pads 262A, 262B, 262C (collectively "262") that create a standoff with a circuit member 264 in accordance with an embodiment of the present disclosure. The terminal pads 262 can extend beyond the packaging 266 and maintain a gap 268 between the packaging 266 and the circuit member 264. The various dielectric layers 270 provide a degree of compliance, especially for the terminal pads 262A and 262B, which are coupled to the conductive traces 272 to create an offset relative to the terminal pads 274A, 274B. In one embodiment, the IC package 260 is electrically coupled with contact pads 276 on circuit member 264 without solder.

FIG. 10 is an alternate IC package 300 with terminal pads 302A, 302B, 302C (collectively "302"), which also create a standoff with a circuit member 304 in accordance with an embodiment of the present disclosure. Compliant material 306 can be printed to the interconnect assembly 308 around orthogonally oriented conductive traces 310 to promote compliance of the terminal pads 302. The compliant material 306 near the terminals 302 can provide stress decoupling. The geometry of the terminals 302 can provide a more reliable connection than a solder ball when plugged into a solderless socket. In one embodiment, the IC package 300 can be electrically coupled with contact pads 312 on the circuit member 304 without solder.

FIG. 11 is an IC package 350 with multiple IC devices 352, 354, also known as a system in package, in accordance with an embodiment of the present disclosure. Interconnect assembly 356 can be electrically coupled with interconnect assembly 360 via extension 358, such as for example, a flexible circuit member. Both IC devices 352, 354 and the interconnect assemblies 356, 360 are contained within packaging 362. Terminal pads 364 can provide a connection to circuit member 366.

The IC package 350 can include a plurality of electrical devices 370A, 370B, 370C printed on the interconnect assembly 356. Additional electrical devices 368 can be optionally printed on or integrally with the packaging 362.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the invention. The upper and lower limits of these smaller ranges which may independently be included in the smaller ranges is also encompassed within the embodiments of the invention, subject to any specifically excluded limit in the stated range. Where the stated range includes one or both of the limits, ranges excluding either both of those included limits are also included in the embodiments of the invention.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the embodiments of the present invention are not entitled to antedate such publication by virtue of prior invention. Further, the dates of publication provided may be different from the actual publication dates which may need to be independently confirmed.

Other embodiments of the invention are possible. Although the description above contains much specificity, these should not be construed as limiting the scope of the invention, but as merely providing illustrations of some of the presently preferred embodiments of this invention. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the invention. Thus, it is intended that the scope of at least some of the present invention herein disclosed should not be limited by the particular disclosed embodiments described above.

Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims.

What is claimed is:

1. An integrated circuit (IC) package for an IC device, the IC package comprising:
    an interconnect assembly with first and second major surfaces, the interconnect assembly comprising;
        a plurality of dielectric layers selectively printed with first and second recesses, the first recesses corresponding to a plurality of first contact members located along the first major surface, a plurality of second contact members located along the second major surface, and a plurality of printed conductive traces electrically coupling a plurality of the first and second contact members;
        a conductive material deposited in at least a portion of the first recesses to form the first contact members, the second contact members, and the conductive traces;
        a compliant material deposited in the second recesses in the plurality of dielectric layers, the complaint material positioned to bias at least the first contact members against terminals on the IC device; and
    packaging substantially surrounding the IC device and the interconnect assembly, wherein the second contact members are accessible from outside the packaging.

2. The IC package of claim 1, wherein the conductive traces create an offset between a plurality of the first contact members relative to a corresponding plurality of the second contact members.

3. The IC package of claim 1, wherein a conductive material, a non-conductive material, and a semi-conductive material are printed on a single layer.

4. The IC package of claim 1, wherein a portion of the compliant material is positioned to bias the second contact members against contact pads on another circuit member.

5. The IC package of claim 1, wherein the interconnect assembly comprises at least one additional circuitry plane, the at least one additional circuitry plane comprises one of a ground plane, a power plane, an electrical connection to other circuit members, a dielectric layer, and a flexible circuit.

6. The IC package of claim 1, wherein the dielectric layers comprise a platable material.

7. The IC package of claim 1, wherein the interconnect assembly extends beyond a perimeter edge of the IC package.

8. The IC package of claim 1, further comprising a flexible circuit member electrically coupled to the interconnect assembly that extends beyond a perimeter edge of the IC package.

9. The IC package of claim 1, further comprising at least one electrical device printed on the interconnect assembly and electrically coupled to one or more of the conductive traces, wherein the electrical device is selected from one of shielding, near device decoupling, capacitors, transistors, resistors, filters, signal or power altering and enhancing devices, memory devices, embedded IC, or RF antennae.

10. The IC package of claim 1, further comprising at least one electrical device printed on the packaging.

11. The IC package of claim 1, wherein the packaging comprises one or more of a preformed package, an encapsulating material, or a combination thereof.

12. An integrated circuit (IC) package for an IC device, the IC package comprising:
    an interconnect assembly with first and second major surfaces, the interconnect assembly comprising;
        a plurality of dielectric layers selectively printed with first and second recesses, the first recesses corresponding to a plurality of first contact members located along the first major surface, a plurality of second contact members located along the second major surface, and a plurality of printed conductive traces electrically coupling a plurality of the first and second contact members;
        a conductive material deposited in at least a portion of the first recesses to form the first contact members, the second contact members, and the conductive traces;
        a compliant material deposited in the second recesses in the plurality of dielectric layers positioned to bias at least the first contact members against terminals on the IC device;
    at least one IC device with terminals compressively engaged with the first contact members, the compliant layer biasing the first contact members against the terminals on the IC device; and
    packaging substantially surrounding the IC device and the interconnect assembly, the second contact members accessible from outside the packaging.

13. The IC package of claim 12 comprising a plating layer located on the conductive material.

14. The IC package of claim 12, wherein the conductive traces create an offset between a plurality of the first contact members relative to a corresponding plurality of the second contact members.

15. The IC package of claim 12, wherein a conductive material, a non-conductive material, and a semi-conductive material are printed on a single layer.

16. The IC package of claim 12, further comprising a plurality of IC devices electrically coupled to the interconnect assembly.

17. The IC package of claim 12, further comprising:
    a plurality of interconnect assemblies electrically coupled to one or more of the second contact members; and
    a plurality of IC devices each electrically coupled to one of the interconnect assemblies.

18. The IC package of claim 12, further comprising a plurality of electrical devices printed on the interconnect assembly and electrically coupled to one or more of the conductive traces.

19. An electrical system comprising:
    the IC package of claim 15; and
    a printed circuit board electrically coupled with the second contact members.

20. A method of making an IC package comprising the steps of:
    forming an interconnect assembly by
        printing at least one dielectric layer onto a surface of a fixture,
        depositing a conductive material comprising first contact members, printing a compliant layer along at least the first contact members, printing a plurality of conductive traces electrically coupled with one or more of the first contact members, forming a plurality of second contact members along a second major surface of the interconnect assembly, and removing the interconnect assembly from the fixture;

compressively engaging terminals on at least one IC device with the first contact members, the compliant layer biasing the first contact members against the terminals on the IC device; and substantially surrounding the IC device and the interconnect assembly with packaging, the second contact members accessible from outside the packaging.

21. The method of claim 20, wherein the conductive traces comprise substantially rectangular cross-sectional shapes.

22. The method of claim 20, further comprising printing a conductive material, a non-conductive material, and a semi-conductive material on a single layer.

23. The method of claim 20, wherein the step of forming an interconnect assembly further comprises:

depositing the conductive material into a plurality of the cavities in the fixture; and processing the conductive material to form the plurality of contact members along the first and second major surfaces of the interconnect assembly.

24. The method of claim 20, wherein the step of forming an interconnect assembly further comprises:

printing a second base layer of a dielectric material onto a surface of a fixture;

depositing a conductive material into a plurality of the cavities in the fixture;

processing the conductive material to form a plurality of second contact members; and coupling the second contact members with the conductive traces on the interconnect assembly so the second contact members extend along the second major surface of the interconnect assembly.

25. The method of claim 20, wherein the step of forming an interconnect assembly further comprises forming at least one additional circuitry plane in the interconnect assembly.

26. The method of claim 20, further comprising electrically coupling a flexible circuit member to the interconnect assembly and extending the flexible circuit member beyond a perimeter edge of the packaging.

27. The method of claim 20, wherein the step of forming an interconnect assembly further comprises:

printing at least one electrical devices on the interconnect assembly; and electrically coupling the electrical device to at least one contact member.

28. The method of claim 20, wherein the step of forming an interconnect assembly further comprises processing the conductive material, wherein processing comprises one of sintering, plating, or curing.

29. A method of making an electrical assembly comprising:

electrically coupling the second contact members on the IC package of claim 1 with a printed circuit board.

30. The IC package of claim 1 comprising a plating layer located on the conductive material.

* * * * *